(12) United States Patent  
Tadayon et al.

(10) Patent No.: US 11,061,068 B2  
(45) Date of Patent: Jul. 13, 2021

(54) MULTI-MEMBER TEST PROBE STRUCTURE

(71) Applicant: Intel Corporation, Santa Clara, CA (US)

(72) Inventors: Pooya Tadayon, Portland, OR (US); Justin Huttula, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 682 days.

(21) Appl. No.: 15/832,650

(22) Filed: Dec. 5, 2017

(65) Prior Publication Data

US 2019/0170810 A1   Jun. 6, 2019

(51) Int. Cl.
*G01R 31/28* (2006.01)
*G01R 3/00* (2006.01)
*G01R 1/067* (2006.01)

(52) U.S. Cl.
CPC ..... *G01R 31/2853* (2013.01); *G01R 1/06738* (2013.01); *G01R 3/00* (2013.01); *G01R 31/2889* (2013.01)

(58) Field of Classification Search
CPC .. G01R 31/2853; G01R 1/06738; G01R 3/00; G01R 31/2889
USPC ........................ 324/750.24, 750.16, 537, 500
See application file for complete search history.

(56) References Cited

U.S. PATENT DOCUMENTS

| | | |
|---|---|---|
| 3,622,387 A | 11/1971 | Grandadam |
| 4,581,260 A | 4/1986 | Mawla |
| 5,307,560 A | 5/1994 | Aksu |
| 5,453,701 A | 9/1995 | Jensen et al. |
| 5,592,222 A | 1/1997 | Nakamura et al. |
| 5,767,692 A | 6/1998 | Antonello et al. |
| 5,917,329 A | 6/1999 | Cadwallader et al. |

(Continued)

FOREIGN PATENT DOCUMENTS

| | | |
|---|---|---|
| EP | 0962776 | 12/1999 |
| JP | 11-344510 | 12/1999 |

OTHER PUBLICATIONS

Darling, K.A. et al., "Mitigating grain growth in binary nanocrystalline alloys through solute selection based on thermodynamic stability maps", Computational Material Science; 84 (2014), 255-266.

(Continued)

*Primary Examiner* — Giovanni Astacio-Oquendo
(74) *Attorney, Agent, or Firm* — Green, Howard & Mughal LLP.

(57) ABSTRACT

A testing arrangement for testing Integrated Circuit (IC) interconnects is provided. In an example, the testing arrangement includes a substrate, and a first interconnect structure. The first interconnect structure may include a first member having a first end to attach to the substrate and a second end opposite the first end, and a second member having a first end to attach to the substrate and a second end opposite the first end. In some examples, the second end of the first member and the second end of the second member are to contact a second interconnect structure of a IC device under test, and the first end of the first member and the first end of the second member are coupled such that the first member and the second member are to transmit, in parallel, current to the second interconnect structure of the IC device under test.

20 Claims, 24 Drawing Sheets

(56) References Cited

U.S. PATENT DOCUMENTS

| | | | |
|---|---|---|---|
| 6,130,545 A | 10/2000 | Kiser et al. | |
| 6,292,004 B1 | 9/2001 | Kocher | |
| 6,356,090 B2 | 3/2002 | Deshayes | |
| 6,441,315 B1 | 8/2002 | Eldridge et al. | |
| 6,740,163 B1 | 5/2004 | Curtiss et al. | |
| 6,812,718 B1* | 11/2004 | Chong | G01R 1/07342 |
| | | | 324/754.07 |
| 7,189,077 B1 | 3/2007 | Eldridge et al. | |
| 7,436,193 B2 | 10/2008 | Crippen | |
| 7,566,228 B2 | 7/2009 | Chiu | |
| 7,884,632 B2 | 2/2011 | Shiraishi et al. | |
| 7,928,522 B2 | 4/2011 | Zhu et al. | |
| 8,029,291 B2 | 10/2011 | Park | |
| 8,411,550 B2 | 4/2013 | Chou et al. | |
| 2002/0024347 A1 | 2/2002 | Felici et al. | |
| 2002/0163349 A1 | 11/2002 | Wada et al. | |
| 2005/0151547 A1 | 7/2005 | Machida et al. | |
| 2005/0231855 A1 | 10/2005 | Tran | |
| 2005/0263401 A1 | 12/2005 | Olsen et al. | |
| 2006/0151614 A1 | 7/2006 | Nishizawa et al. | |
| 2006/0171425 A1 | 8/2006 | Lee et al. | |
| 2007/0126435 A1 | 6/2007 | Eldridge et al. | |
| 2007/0126440 A1 | 6/2007 | Hobbs et al. | |
| 2007/0290371 A1* | 12/2007 | Chen | H01L 22/32 |
| | | | 257/784 |
| 2008/0088327 A1 | 4/2008 | Kister | |
| 2008/0196474 A1 | 8/2008 | Di Stefano et al. | |
| 2008/0204061 A1 | 8/2008 | Chartarifsky et al. | |
| 2008/0231300 A1 | 9/2008 | Yamada et al. | |
| 2008/0309363 A1 | 12/2008 | Jeon et al. | |
| 2009/0219047 A1 | 9/2009 | Peterson et al. | |
| 2009/0237099 A1 | 9/2009 | Garabedian et al. | |
| 2010/0052715 A1 | 3/2010 | Beaman et al. | |
| 2010/0066393 A1 | 3/2010 | Bottoms et al. | |
| 2010/0079159 A1 | 4/2010 | Kemmerling | |
| 2010/0276572 A1 | 11/2010 | Iwabuchi et al. | |
| 2011/0031991 A1 | 2/2011 | Lee et al. | |
| 2011/0115513 A1 | 5/2011 | Harada | |
| 2011/0234251 A1 | 9/2011 | Komatsu et al. | |
| 2012/0038383 A1 | 2/2012 | Wu et al. | |
| 2012/0071037 A1 | 3/2012 | Balucani | |
| 2012/0117799 A1 | 5/2012 | Luo | |
| 2012/0319710 A1 | 12/2012 | Dabrowiecki et al. | |
| 2013/0002285 A1 | 1/2013 | Nelson et al. | |
| 2013/0099812 A1 | 4/2013 | Wang et al. | |
| 2013/0200910 A1 | 8/2013 | Ellis-Monaghan et al. | |
| 2013/0285688 A1 | 10/2013 | Namburi et al. | |
| 2014/0021976 A1 | 1/2014 | Tanaka | |
| 2014/0125372 A1 | 5/2014 | Fukasawa et al. | |
| 2014/0253162 A1 | 9/2014 | Wang | |
| 2014/0347085 A1 | 11/2014 | Kuo et al. | |
| 2014/0362425 A1 | 12/2014 | Stephens et al. | |
| 2014/0363905 A1 | 12/2014 | McShane et al. | |
| 2015/0123693 A1 | 5/2015 | Ota et al. | |
| 2015/0192633 A1 | 7/2015 | Garibay et al. | |
| 2016/0079635 A1 | 3/2016 | Niwa | |
| 2016/0178663 A1 | 6/2016 | Prabhugoud et al. | |
| 2017/0219626 A1 | 8/2017 | Gardell et al. | |
| 2018/0003767 A1 | 1/2018 | Crippa et al. | |
| 2019/0203370 A1* | 7/2019 | Walczyk | C25D 5/026 |
| 2019/0212366 A1 | 7/2019 | Tadayon et al. | |
| 2020/0025801 A1 | 1/2020 | Tadayon et al. | |

OTHER PUBLICATIONS

Luo, J.K. et al., "Young's modulus of electroplated Ni thin film for MEMS applications", Materials Letters, vol. 58, Issues 17-18, Jul. 2004, pp. 2306-2309.

Weeden, et al., "Probe Card Tutorial", www.tek.com/keithley, 2003, 40 pages, Keithley Instruments, Inc.

Wikipedia, "Probe Card", last edited on Jul. 29, 2016, 2 pages, Wikipeadia, https://en.wikipedia.org/wiki/probe_card.

* cited by examiner

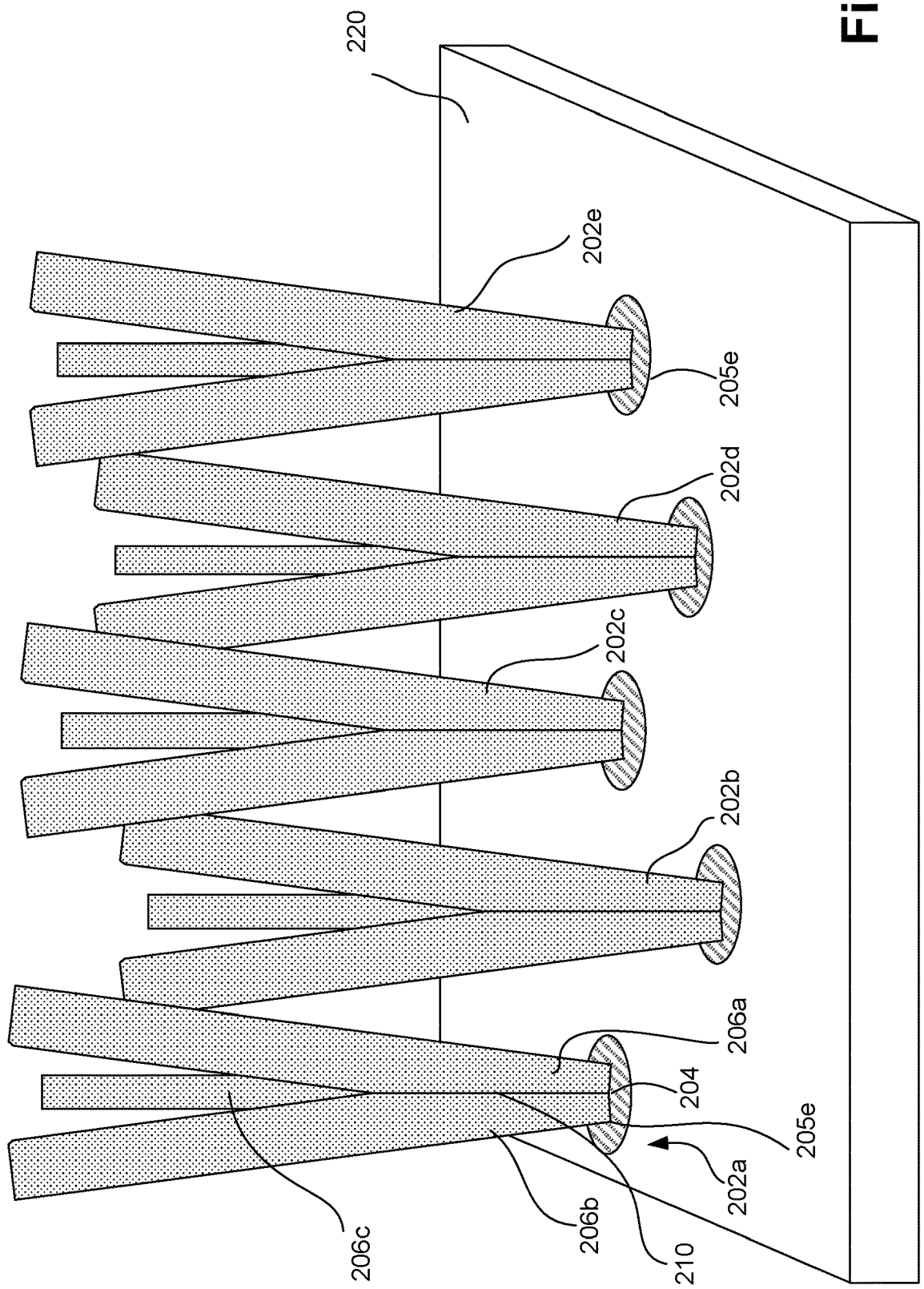

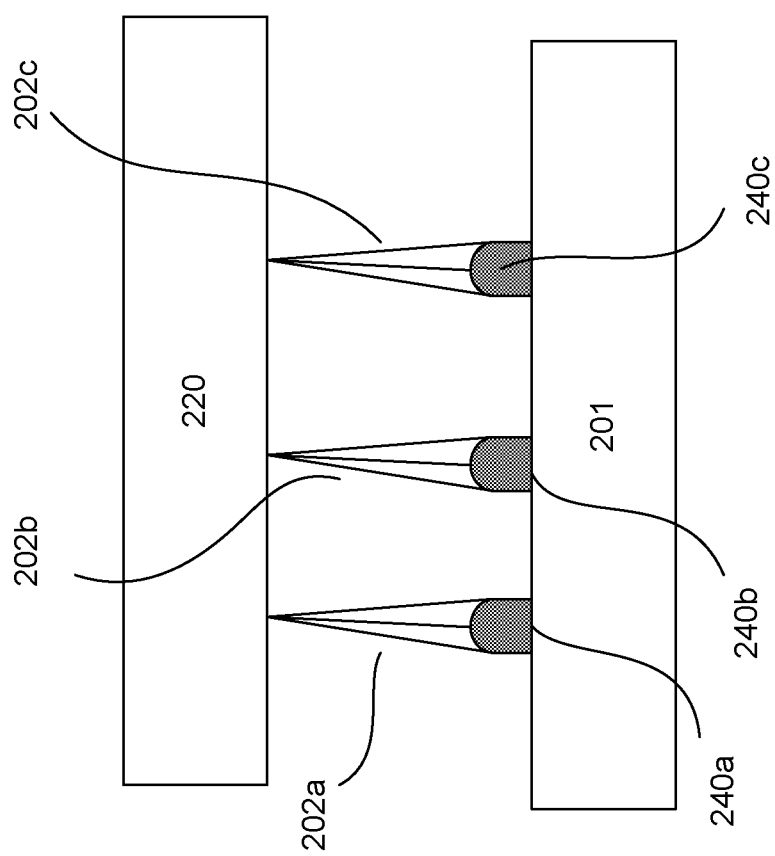

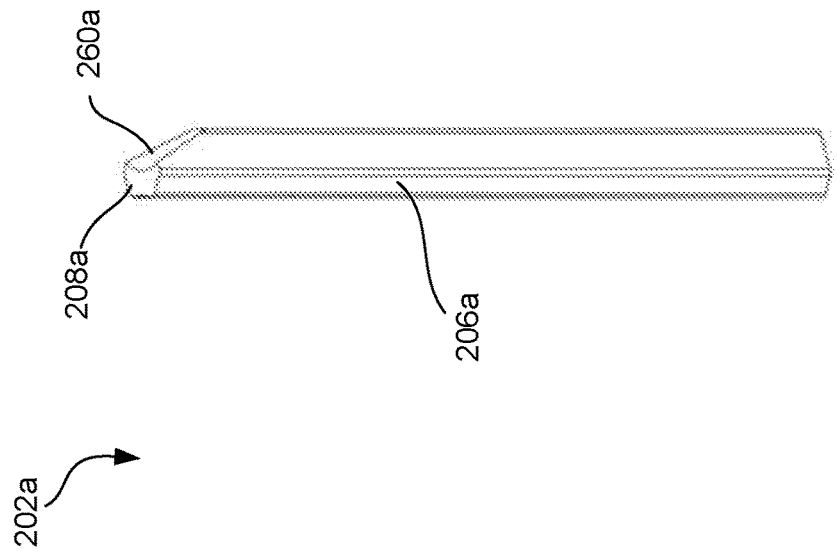
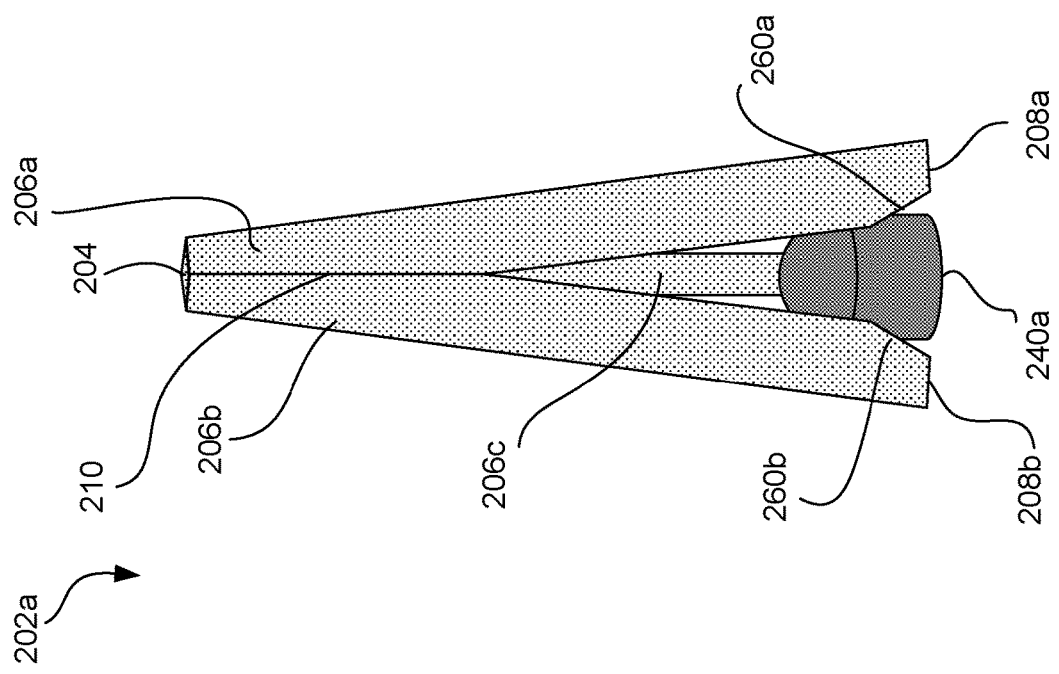

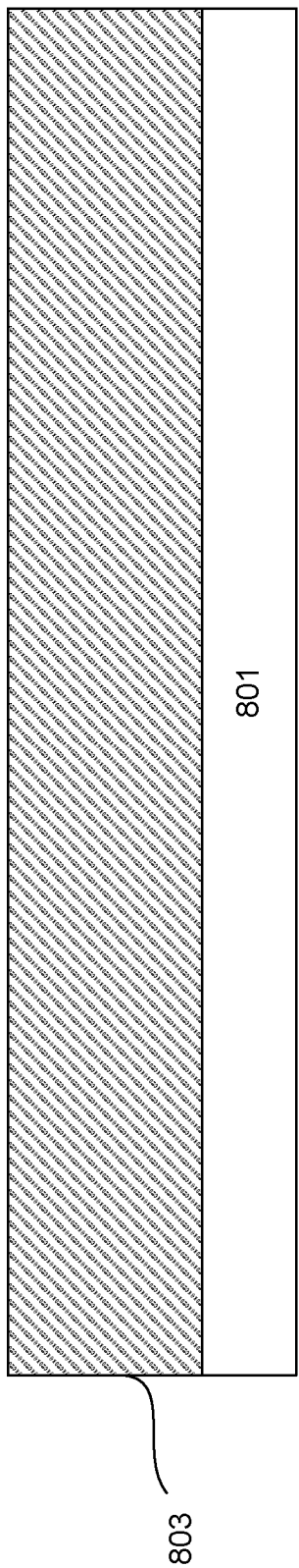
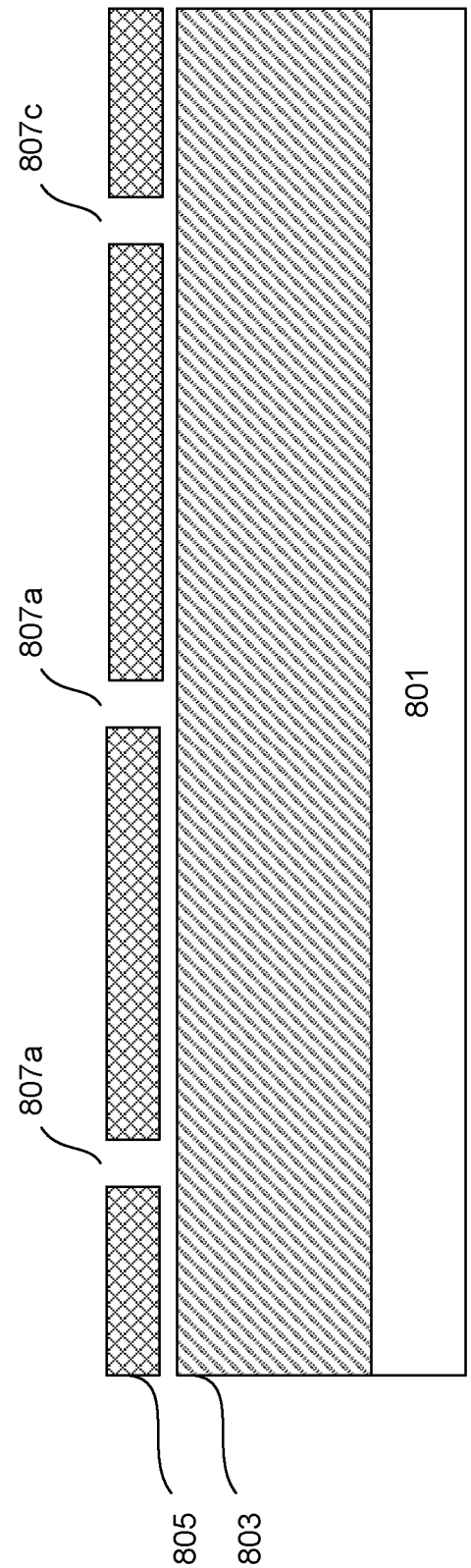

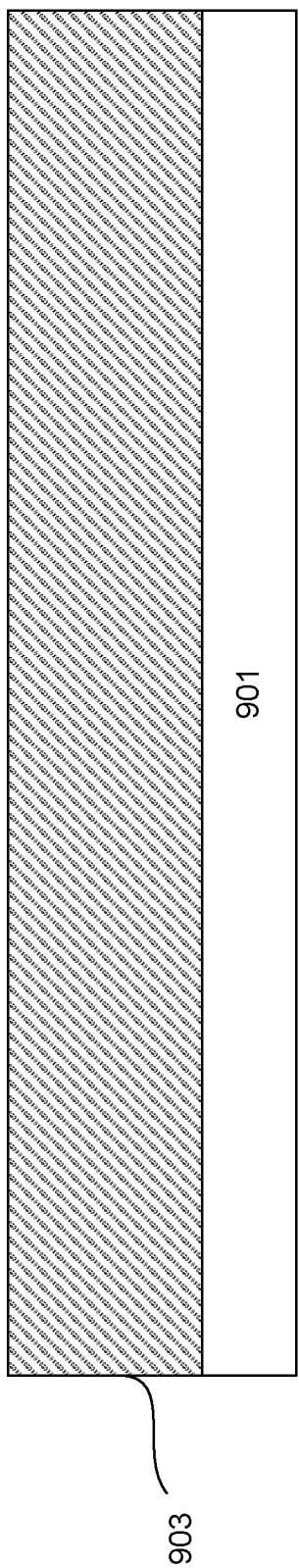
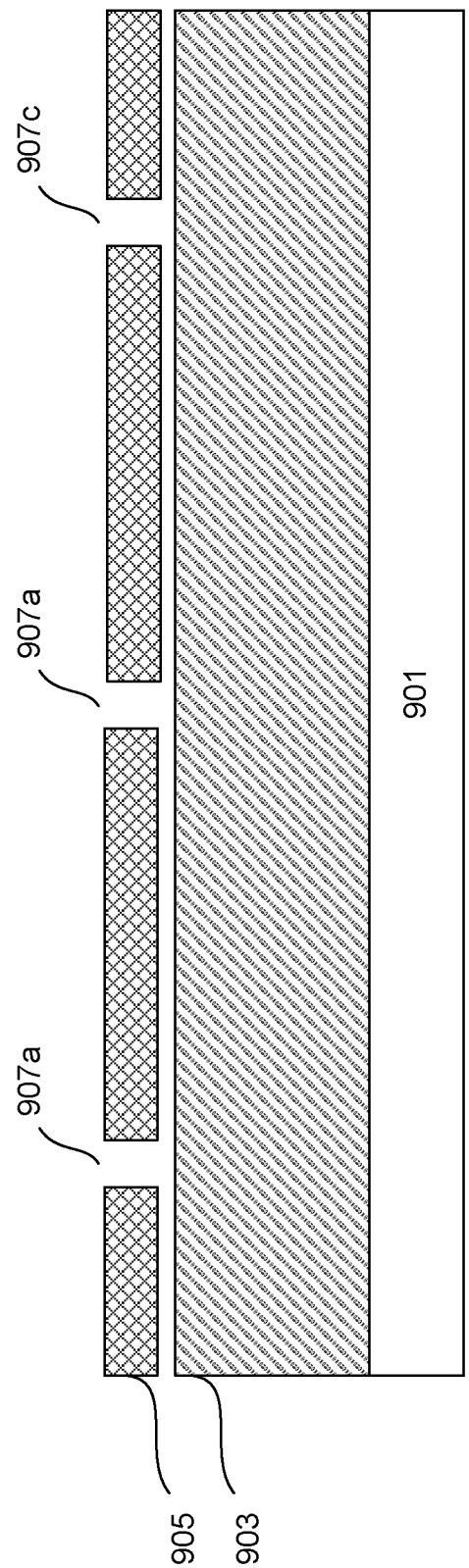
Fig. 9A
Fig. 9B

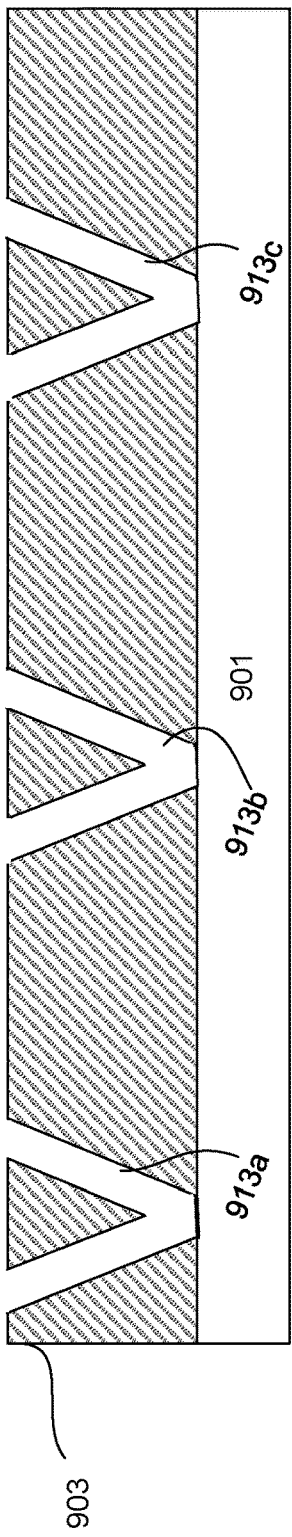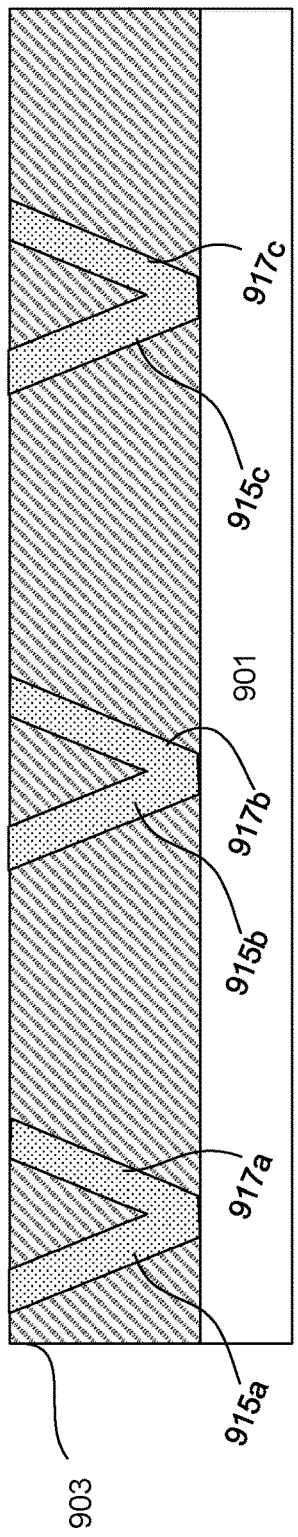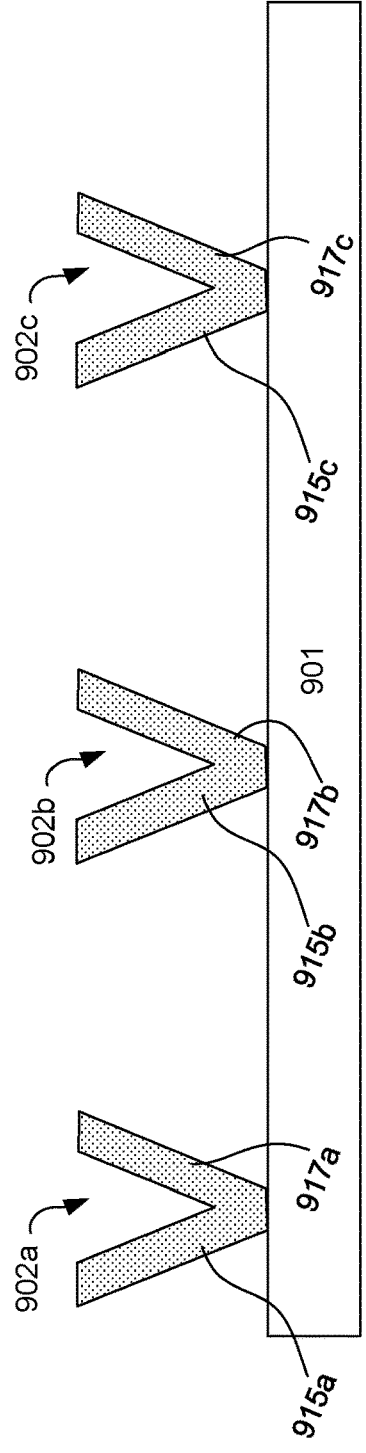

MULTI-MEMBER TEST PROBE STRUCTURE

BACKGROUND

As silicon bump pitch of integrated circuit (IC) devices scales to smaller and smaller dimensions, an ability to provide a probing solution that meets the mechanical and electrical requirements of testing becomes more and more challenging.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 2B illustrates a plurality of multi-member test probes attached to a test card, according to some embodiments.

FIG. 2C schematically illustrates a cross section view of a plurality of multi-member test probes attached to a DUT and a test card, according to some embodiments.

FIGS. 2E-2F illustrate chamfered tips of members of a multi-member test probe, to accommodate an interconnect structure within tips of the members, according to some embodiments.

FIGS. 8A, 8B, 8C, 8D, 8E, 8F, 8G, and 8H illustrate example processes for formation of a plurality of multi-member probes on a test card, where the members of the probes comprise conductive material coated on a polymer, according to some embodiments.

FIGS. 9A, 9B, 9C, 9D, 9E, 9F, 9G, and 9H illustrate example processes for formation of a plurality of multi-member probes on a test card, where the members of the probes comprise conductive material, according to some embodiments.

DETAILED DESCRIPTION

Figure 1B:
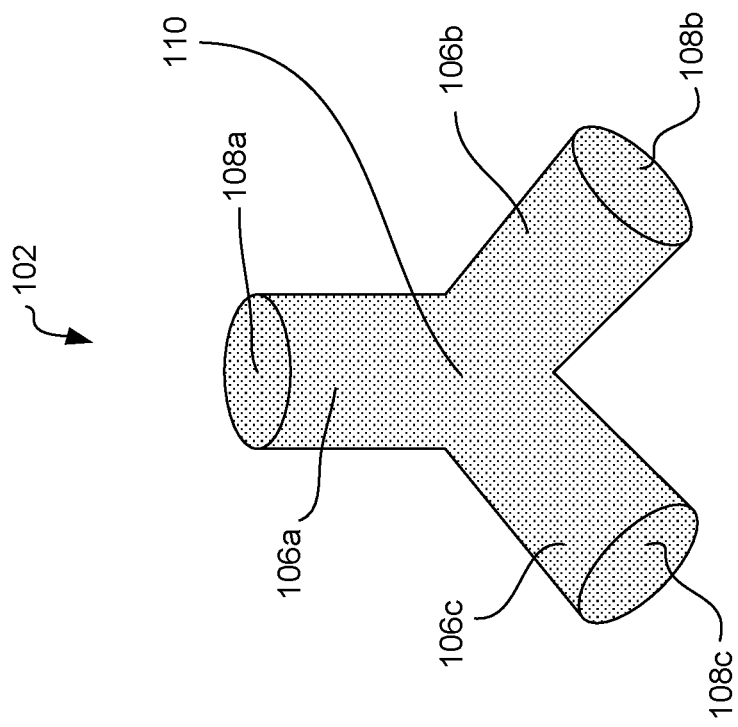
FIGS. 1A and 1B illustrate a multi-member test probe, according to some embodiments.

A testing arrangement may be used to test and/or probe one or more devices under test (DUTs). A DUT may be an integrated circuit (IC) device, e.g., an IC package, an IC die, an IC device at wafer level, a packaged IC device, a bar IC die, a wafer, a packaged IC die, etc., for example. For example, a test probe (e.g., a temporary interconnect structure) of the testing arrangement may make contact with an interconnect structure of the DUT, when the DUT is to be tested by the testing arrangement. In an example, the test probe may conduct current between the testing arrangement and the DUT, e.g., to test and/or probe the DUT.

In some embodiments, a test probe may comprise multiple members, where a member may be shaped like a cantilever beam. For example, the test probe maybe shaped like a dipod, a tripod, a quadpod, or the like, e.g., depending on a number of members in the test probe, where each member can form a corresponding leg of the dipod, tripod, or quadpod structure. A tip of each member of the test probe may contact an interconnect structure of a DUT. For example, the members may pinch or clamp the interconnect structure of the DUT at the tip. The tip of the members may slightly deflect upon contact with the interconnect structure, e.g., upon application of force on the test probe, to make firm contact with the interconnect structure. During test, the members of the test probe may transmit test current in parallel to the interconnect structure. In some embodiments, the probe may have robust current carrying capability, e.g., as the current of the probe during a test may be transmitted by multiple members of the probe in parallel to the interconnect structure of the DUT. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on." The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C). The terms "left," "right," "front," "back," "top," "bottom," "over," "under," and the like in the description and in the claims, if any, are used for descriptive purposes and not necessarily for describing permanent relative positions.

Figure 1A:
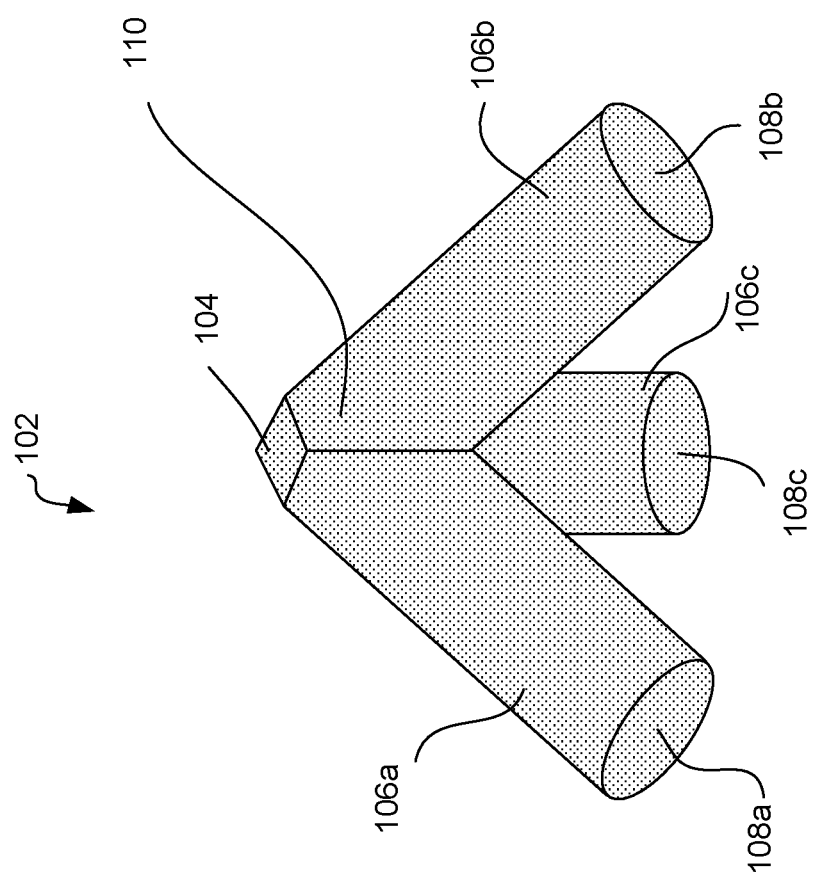

FIGS. 1A and 1B illustrate a multi-member test probe (also referred to herein as a "probe") 102, according to some embodiments. FIG. 1A illustrates a side perspective view of the probe 102. FIG. 1B is a view of the probe 102, when viewed from a bottom side of the side perspective view of FIG. 1A.

In some embodiments, the probe 102 has multiple members, e.g., members 106a, 106b, 106c. Elements referred to herein in this disclosure with a common reference label followed by a particular number or alphabet may be collectively referred to by the reference label alone. For example, members 106a, 106b, 106c may be collectively and generally referred to as members 106 in plural, and member 106a in singular.

In an example, the probe 102 may have a shape of a tripod, with the members 106 forming three legs or three cantilever beams of the tripod. The members 106 are also referred to herein as legs or beams. The legs of the tripod (e.g., the members 106) may be attached to a common node 110 of the probe 102. Thus, each member 106 has a first end or a base attached to the node 110, and a tip that is at an opposite end of the base. A bottom surface of a member 106 at the tip of the member is labeled as 108. For example, the member 106a has a bottom surface 108a, the member 106b has a bottom surface 108b, and the member 106c has a bottom surface 108c.

FIG. 1A illustrates a top surface 104 of the probe 102, which may be the top surface of the node 110 (the top surface 104 is not visible in FIG. 1B). In some embodiments, the top surface 104 may be coupled to a test card (not illustrated in FIGS. 1A-1B).

Although FIGS. 1A-1B illustrate the probe 102 including three members 106a, 106b, and 106c, in some other embodiments (and not illustrated in FIGS. 1A-1B), the probe 102 may comprise two members (e.g., have a structure similar to a dipod), four members (e.g., have a structure similar to a quadpod), or even higher number of members.

Figure 2A:
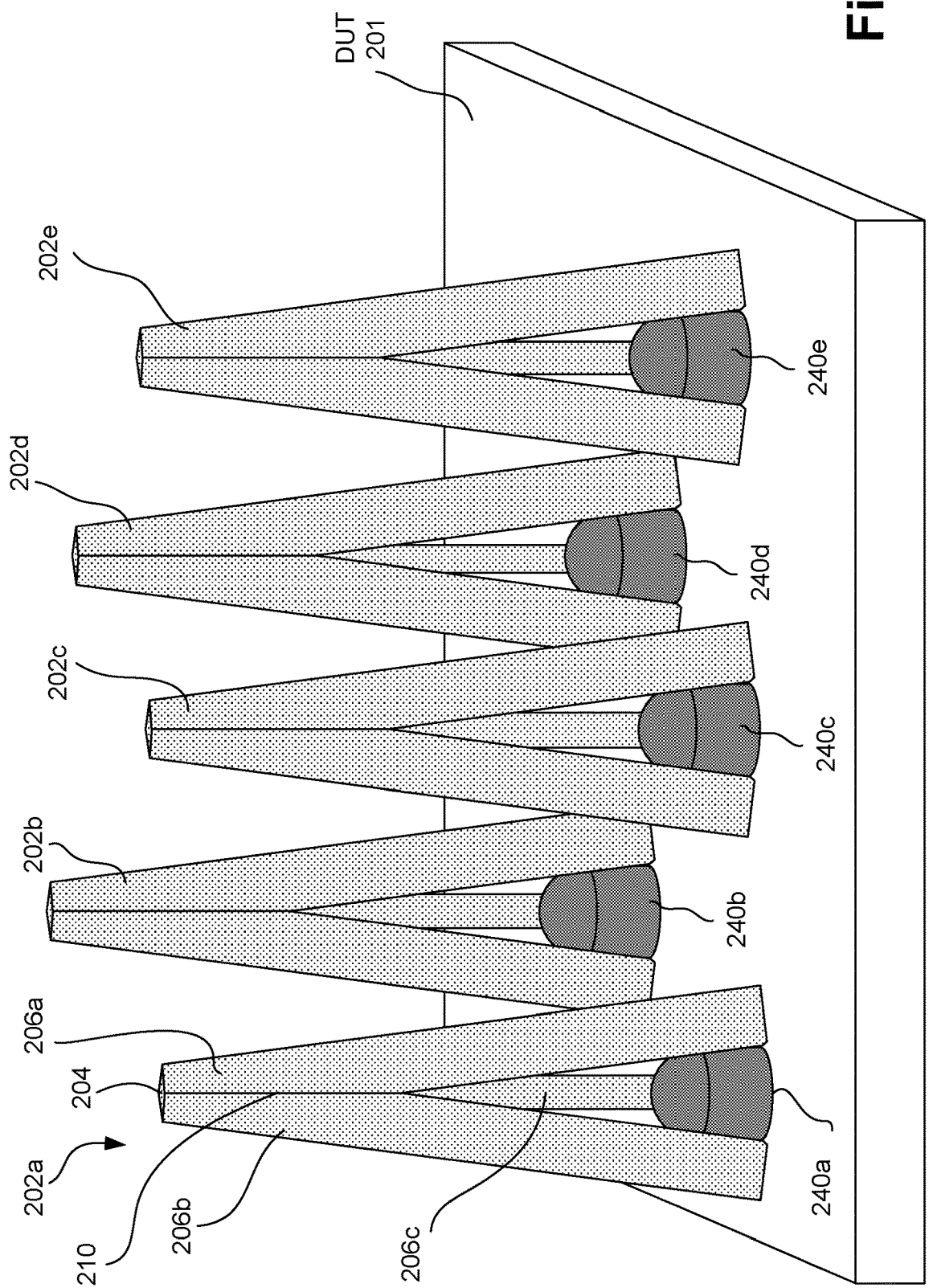
FIG. 2A illustrates a plurality of multi-member test probes in temporary contact with a corresponding plurality of interconnect structures of a device under test (DUT), according to some embodiments.

FIG. 2A illustrates a plurality of multi-member test probes 202a, 202b, 202e in temporary contact with (e.g., removably attached to) a corresponding plurality of interconnect structures 240a, 240b, . . . , 240e of a device under test (DUT) 201, according to some embodiments. Individual ones of the probes 202 may be similar to the probe 102 of FIGS. 1A-1B (although the members of the probes 202 are illustrated to be longer than the members of the probe 106, e.g., for purposes of illustrative clarity). For example, each probe 202 has corresponding three members. The members of the probe 202a are labelled in FIG. 2A. For example, the probe 202a comprises members 206a, 206b, 206c attached to a common node 210, and has a top surface 204, e.g., similar to the probe 106 of FIGS. 1A-1B.

In some embodiments, each probe 202 may be in temporary contact with (e.g., removably attached to) a corresponding interconnect structure 240 of the DUT 201 (e.g., be in temporary contact with the interconnect structure 240, while the DUT 201 is being tested). In some embodiments, the DUT 201 may be any appropriate integrated circuit (IC), an IC package, a System on a Chip (SOC), an IC die, a bar IC die, a wafer, a packaged IC die, an IC device at wafer level, a packaged IC device, and/or another appropriate component. In some embodiments, the DUT 201 may comprise the plurality of interconnect structures 240a, 240b, . . . , 240e. Although five interconnect structures of the DUT 201 and five corresponding probes 202 are illustrated in FIG. 2A, the DUT 201 is likely to include a larger number of interconnect structures 240, and there may be a corresponding larger number of probes 202. Individual interconnect structures 240 may comprise, for example, metal pillars, bumps, bump pads, balls formed using metals, alloys, solderable material, solder balls, and/or the like.

In some embodiments, the top surfaces 204 of the probes 202 may be attached to a test card (e.g., to a substrate of the test card), although the test card is not illustrated in FIG. 2A for purposes of illustrative clarity. FIG. 2B illustrates the plurality of multi-member test probes 202a, 202b, . . . , 202e of FIG. 2A attached to a test card 220, according to some embodiments. Note that FIG. 2B does not illustrate the DUT 201 and the interconnect structures 240. Also, the probes 202 in FIG. 2B are illustrated to be in a vertically opposite manner (e.g., up-side down) relative to the illustration of the probes 202 in FIG. 2A.

As illustrated in FIG. 2B, sidewalls of the members 206 of a probe 202 (e.g., the sidewall 206a of the probe 202a) may be at an angle that is less than 90 degrees with respect to the surface of the test card 220. In some embodiments, the members of a probe 202 (e.g., members 206a, 206b, and 206c) are not parallel to each other (e.g., as the members join with each other at one end, and have a space there between at the other end).

In some embodiments, the top surfaces of each probe 202 may be attached to a conductive contact pad 205 on the surface of the test card 220. For example, contact pads 205a and 205e for the probes 202a and 202e, respectively, are labeled in FIG. 2B. A contact pad 205 of a probe 202 facilitates electrical connection between the test card 220 and the probe 202.

FIG. 2C illustrates a cross section view of some of the plurality of multi-member test probes 202a, 202b, . . . , 202e of FIGS. 2A-2B attached to the DUT 201 and the test card 220, according to some embodiments. The illustration of FIG. 2C is merely schematic—for example, the individual member of the probes 202 are illustrated using a line only.

Referring again to FIGS. 2A and 2B, the arrangement of the probes 202 on the test card 220 are similar to the arrangement of the interconnect structures 240 on the DUT 201 such that, for example, when the test card 220 is aligned over the DUT 201, each probe 202 attaches to a corresponding interconnect structure 240. In some embodiments, the members of the probes 202 are arranged such that a member of a probe does not come in contact with another member of another adjacent probe. For example, members of two adjacent probes may be arranged in a staggered or interleaved manner.

The test card 220 may be coupled to a testing apparatus (not illustrated in FIGS. 2A-2C). The testing apparatus and/or the test card 220 may be configured to test a plurality of devices, e.g., including the DUT 201.

In an example, individual test probes 202 are to be removably attached to (e.g., be temporarily in contact with) corresponding ones of the interconnect structures 240 of the DUT 201. For example, when the DUT 201 is to be tested, a test probe 202 is attached to or in contact with a corresponding interconnect structure 240 of the DUT 201. After the testing of the DUT 201 is complete, another device under test replaces the DUT 201, and the test probe 202 is again attached to another interconnect structure of the another device under test. Thus, multiple devices may be tested, e.g., one after another, by the test card 220 and the probes 202.

In an example, the test probes 202 of the test card 220 are interconnect structures of the test card 220 (e.g., which may be temporarily and removably attached to interconnect structures of devices under test). Thus, the probes 202 are also referred to herein as temporary interconnect structures (or test pins) of the test card 220.

Referring to FIGS. 2A-2C, for a probe 202, a base of each of the members are attached at a common node, and a tip of each of the members are removably attached to a corresponding interconnect structure 240. For example, a base of each member 206a, 206b, and 206c is attached to the common node 210, where the common node 210 is attached to the test card 220. Also, the tip of each member 206a, 206b, and 206c is removably attached to the interconnect structure 240a. When the DUT 201 is to be tested by the test card 220, current is transmitted simultaneously from the test card to the interconnect structure of the DUT 240a via three parallel paths corresponding to the three members 206a, 206b, 206c. Thus, in some embodiments, each probe 202 transmits current in parallel through the corresponding members to the corresponding interconnect structure 240 of the DUT 201.

Figure 2D:
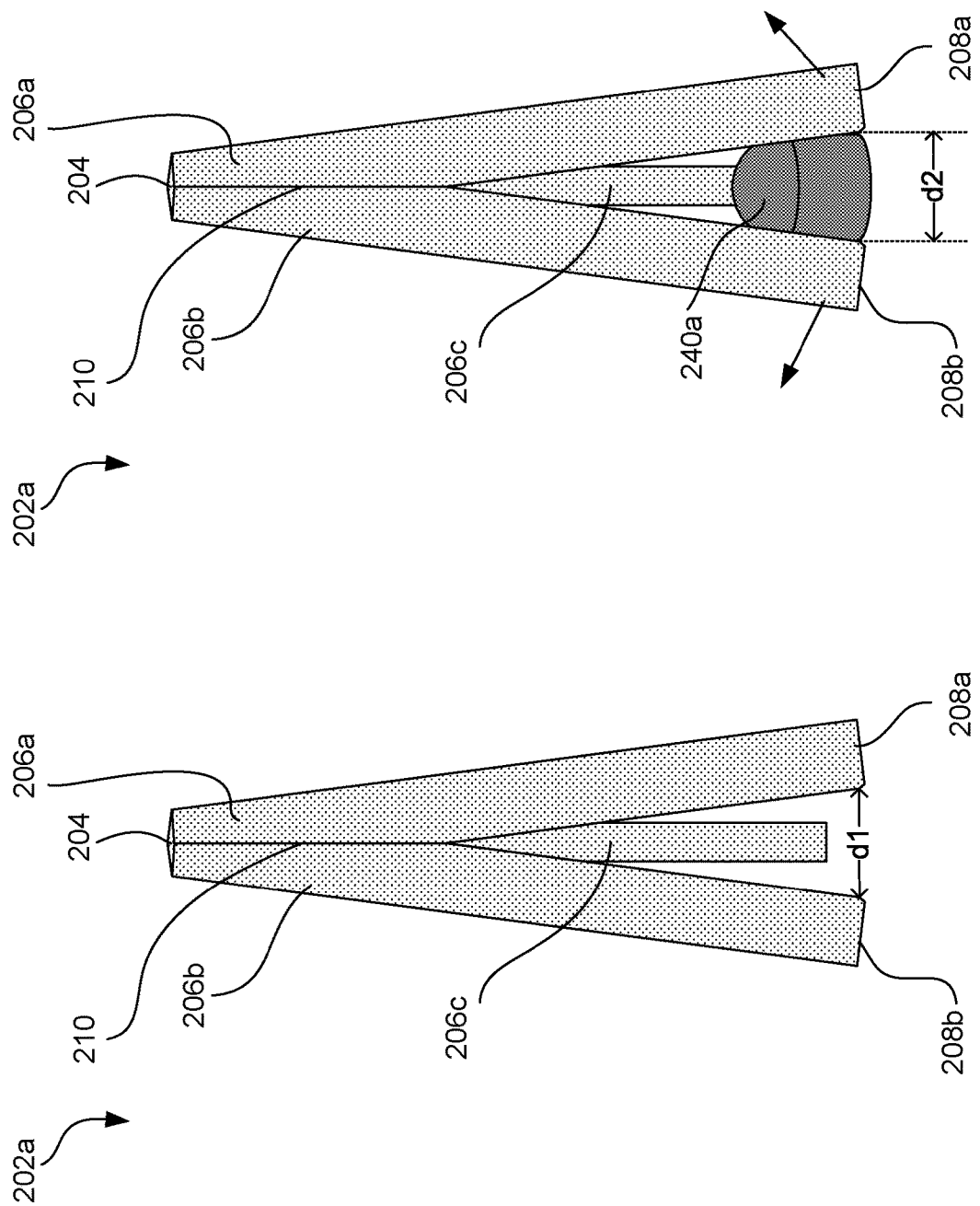
FIG. 2D illustrates a deflection action of a multi-member test probe, according to some embodiments.

FIG. 2D illustrates a single multi-member test probe 202a attached to an interconnect structure 240a of the DUT 201, and also illustrates a deflection action of the probe 202, according to some embodiments. In FIG. 2D, two states of the probe 202a are illustrated—the left side of the figure illustrates the probe 202a while not being attached to the interconnect structure 240a, and the right side of the figure illustrates the probe 202a being attached to the interconnect structure 240a.

In FIG. 2D, the bottom surfaces 208a and 208b of the members 206a and 206b, respectively, are labeled (e.g., which are similar to the bottom surfaces 108a and 108b of FIGS. 1A and 1B). As illustrated from the right side of the figure, in some embodiments, the bottom surfaces 208 of the probe 202a may not be in contact with the interconnect structure 240. Rather, a sidewall of a member 206 near the tip may be in contact with the interconnect structure 240. Thus, the interconnect structure 240a (e.g., which may be solder ball, for example) fits inside the tips of the members 206a, 206b, 206c. For example, the inside surface of the sidewall of each member 206 rubs against the outside of the interconnect structure 240a, and thus, form multiple electrical connections between the members 206 and the interconnect structure 240a.

In some embodiments, referring again to FIGS. 2A-2D, when the DUT 201 is to be tested, the test card 220 and the attached probes 202 are pushed towards the DUT 201 and/or the DUT 201 is pushed towards the test card 220 and the attached probes 202. When the probe 202s is pushed with respect to the interconnect structure 240a, the members 206 deflect outwards. For example, the right side of FIG. 2D illustrates a direction of deflection of the members 206a and 206b. The deflection may be due to the elasticity of the members 206 and the application of the force. The deflection in a member (e.g., member 206a) may be maximum at a tip of the member 206a.

For example, the left side of FIG. 2D illustrates a distance d1 between the tips of the members 206a and 206b, without the probe 202a being attached to the interconnect structure 240a. Also, the right side of FIG. 2D illustrates a distance d2 between the tips of the members 206a and 206b, with the probe 202a being attached to the interconnect structure 240a. In some embodiments, due to the deflection of the members 206, the distance d2 may be larger than the distance d1. Thus, put differently, as the interconnect structure 240a is pushed into the tips of the members 206a, 206b, 206c, the members 206a, 206b, 206c swing or deflect outward, while at the same time scrubbing against the surface of the interconnect structure 240a, thereby forming good electrical contact between the members 206 and the interconnect structure 240a.

In an example, the members 206a, 206b, 206c may clamp or pinch the interconnect structure 240a. For example, a member 206 may be attached to the interconnect structure 240a via a wiping action.

FIGS. 2E-2F illustrate chamfered tips of the members 206 of the multi-member test probe 202a, to accommodate the interconnect structure 240a within the tips of the members 206, according to some embodiments. FIG. 2E illustrates the chamfered tips 260a and 260b of the members 206a and 206b, respectively (e.g., the tip of the member 206c is not visible in this figure). FIG. 2F illustrates one member 206a of the probe, and the chamfered tip 260a of the member 260a. The orientation of the member 206a in FIGS. 2E and 2F are vertically opposite in manner (e.g., one is vertically flipped with respect to another).

A chamfered tip 260a of a member 206a may be formed, for example, by forming an inside sidewall of the member 206a at an angle with the bottom surface 208a, where the angle is less than 90°. For example, the surface of the inside sidewall of the member 206a (e.g., that makes contact with the interconnect structure 240a) may be curved, or at an angle of about 45° (or another angle that is less than 90 degrees) with respect to the bottom surface 208a (e.g., at or near the tip of the member 206a).

In an example, a surface of the chamfered tip 260a may be designed to be somewhat compliment to the outside surface of the interconnect structure 240a. This may result in the surface of the chamfered tip 260a to be in better contact with the surface of the interconnect structure 240a, thereby forming better electrical connection between the member 206a and the interconnect structure 240a.

In FIGS. 2A-2F, the bases of members 206 of a probe 202 (e.g., probe 202a) were joined at a common node (e.g., common node 210), and the common node 210 was attached to the test card 220. In some embodiments, the bases of various members of a probe may not be attached to a common node. For example, FIG. 3 illustrates a single multi-member test probe 302a attached to a test card 320, where the bases on various members of the probe 302a are separately attached to the test card 220, according to some embodiments.

Figure 3:
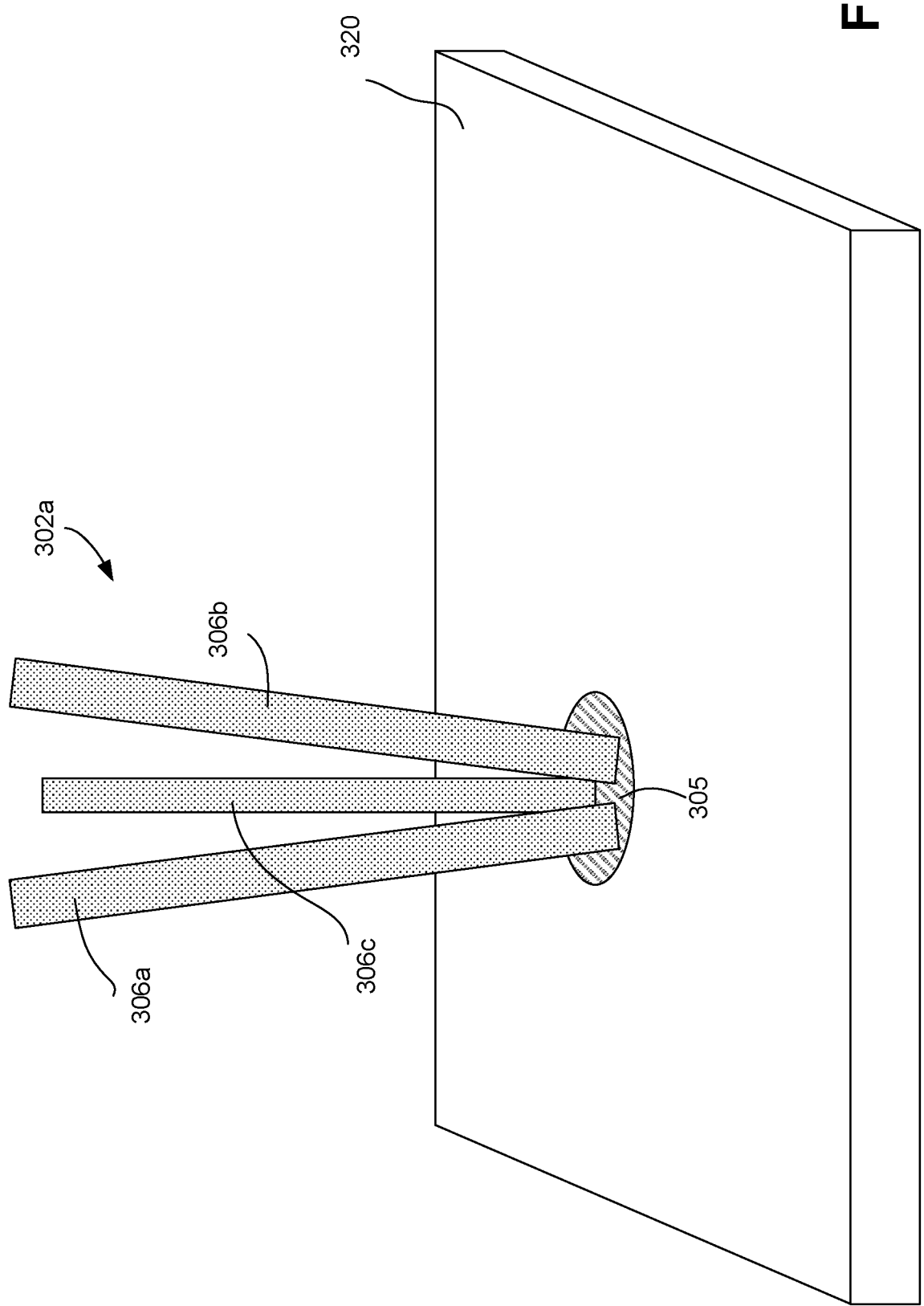
FIG. 3 illustrates a multi-member test probe attached to a test card, where bases on various members of the test probe are separately attached to the test card, according to some embodiments.

In some embodiments, the probe 302a may be similar to the probe 202a of FIGS. 2A-2F, and the discussion with respect to FIGS. 2A-2F may be applicable to the probe 302a of FIG. 3. For example, similar to the probe 202a, the probe 302a may include members 306a, 306b, and 306c. However, unlike the probe 202a, the bases of the members 306a, 306b, and 306c may not be attached to a common node. Rather, the bases of the members 306a, 306b, and 306c may be attached (e.g., separately attached) to the test card 320. For example, the bases of the members 306a, 306b, and 306c may be attached to a common conductive contact pad 305 on the test card 320. The contact pad 305 may facilitate electrical contact between the members 306a, 306b, 306c and the test card 320, and may also electrically connect or short the bases of the members 306a, 306b, and 306c. In some other embodiments (and although not illustrated in FIG. 3), the bases of the members 306a, 306b, 306c may be respectively formed on three different contact pads, and the three contact pads may be shorted or connected via connections (e.g., traces) on the test card 320.

Figure 4B:
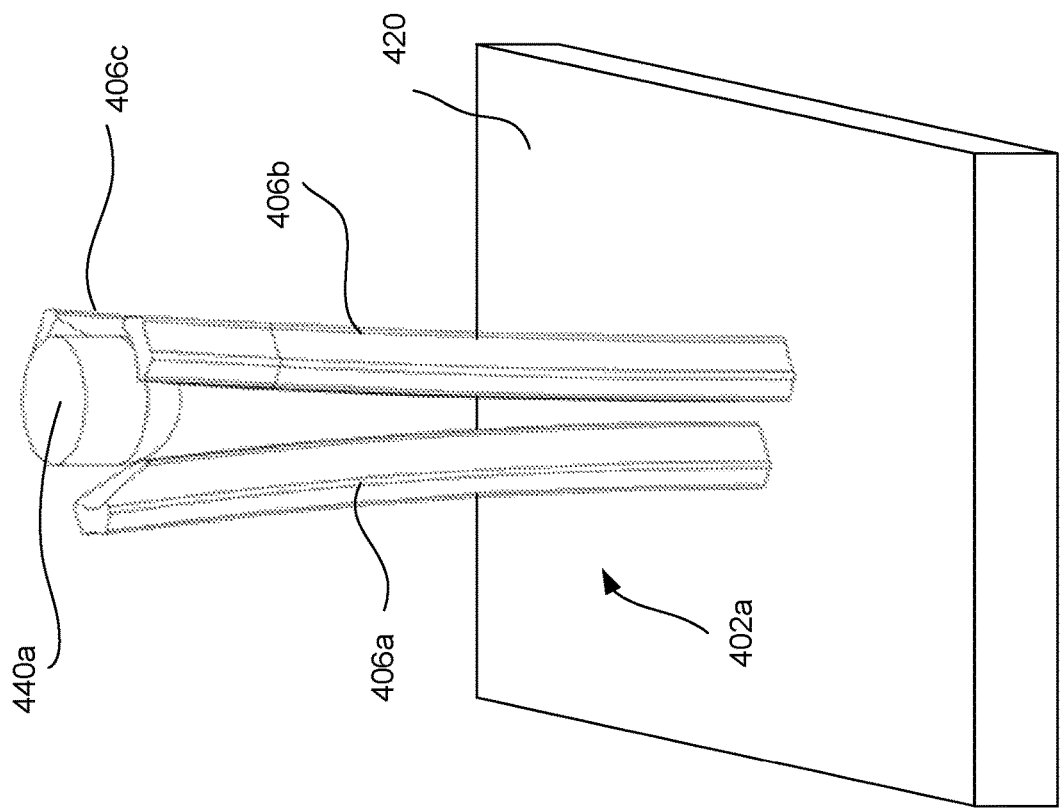
FIGS. 4A-4B illustrate a multi-member test probe attached to a test card, where bases on various members of the test probe are separately attached to the test card, and where the members are substantially perpendicular with respect to the test card, according to some embodiments.
Figure 4A:
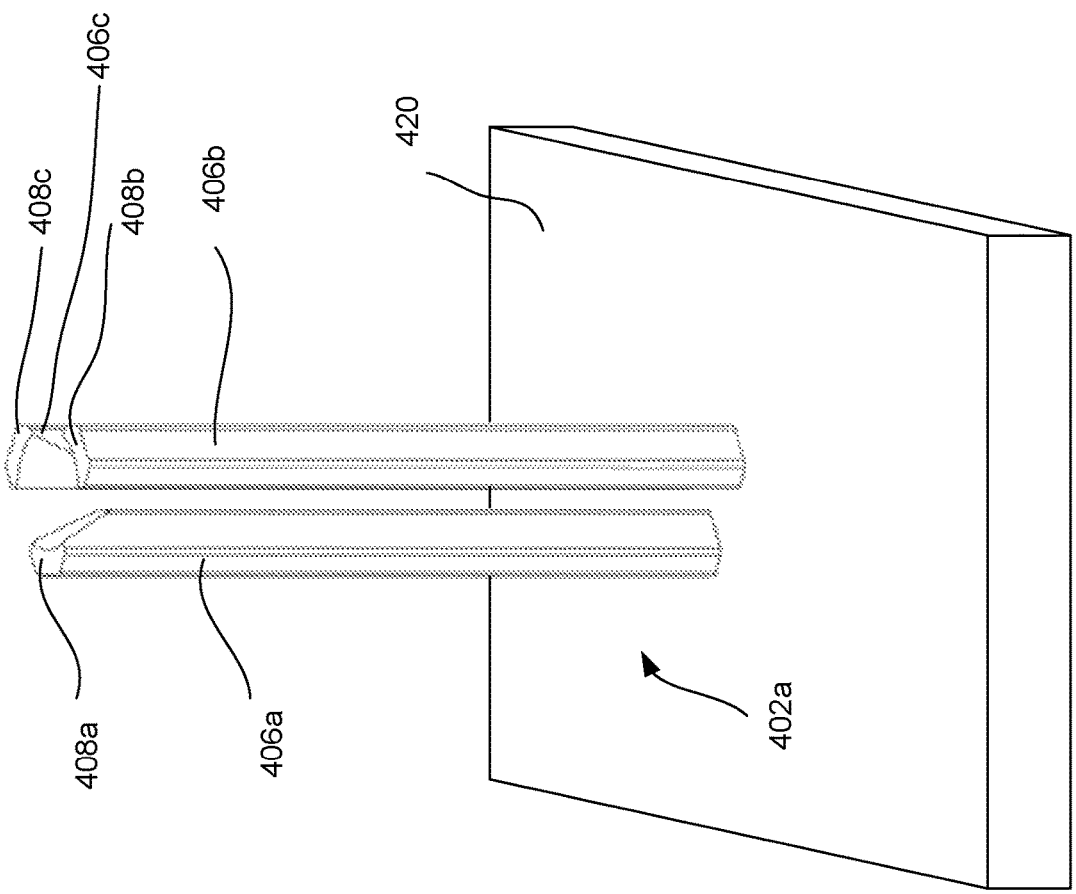

FIGS. 4A-4B illustrate a single multi-member test probe 402a attached to a test card 420, where the bases on various members 606a, 4-6b, 406c of the probe 402a are separately attached to the test card 420, and where the members 606a, 4-6b, 406c are substantially perpendicular with respect to the test card 420, according to some embodiments. FIG. 4A illustrates the probe 402, without any interconnect structure of a DUT being attached to the probe 402a. FIG. 4B illustrates the probe 402, with an interconnect structure 440a of a DUT (although the DUT is not illustrated in FIG. 4B) being attached to the probe 402a.

In some embodiments, the probe 402a may be similar to the probe 202a of FIGS. 2A-2F, and the discussion with respect to FIGS. 2A-2F may be applicable to the probe 402a of FIG. 4. For example, similar to the probe 202a, the probe 402a may include members 406a, 406b, and 406c, where each member may comprise a top surface 408 (e.g., top surfaces 408a, 408b, 408c) at the tip of the members. In some embodiments (e.g., and as also discussed with respect to FIGS. 2E and 2F), the sidewalls at the tip of the members 406 may be chamfered, e.g., to accommodate the interconnect structure 440a within the chamfered sidewalls of the probe 402a.

However, unlike the probe 202a of FIGS. 2A-2F, the bases of the members 406a, 406b, and 406c may not be attached to a common node. Rather, the bases of the members 406a, 406b, and 406c may be attached (e.g., separately attached) to the test card 420. In one example, the bases of the members 406a, 406b, and 406c may be attached to a common conductive contact pad on the test card 420 (although the contact pad is not illustrated in FIGS. 4A-4B). The contact pad may facilitate electrical contact between the members 406a, 406b, 406c and the test card 420, and may also electrically connect or short the bases of the members 406a, 406b, and 406c. In another example (and also although not illustrated in FIGS. 4A-4B), the bases of the members 406a, 406b, 406c may be respectively formed on three different contact pads, and the three contact pads may be shorted or connected via connections (e.g., traces) on the test card 420.

In some embodiments, unlike FIGS. 2A-2F, the members 406 (e.g., sidewalls of the members 406) may be substantially perpendicular to the test card 420 (e.g., at the bases of the respectively members). For example, sidewalls of the member 406a (e.g., sidewalls at least near the base of the member 406a) may be at about 90 degrees with respect to the top surface of the test card 420. In some embodiments, when the interconnect structure 440a is inserted within the tips of the members 406, the tip of the members 406 may deflect outwards, e.g., as illustrated in FIG. 4B.

In some embodiments, at least a section of the sidewalls of the member 406a (e.g., sidewalls at and near the base of the member 406a) may be substantially parallel to at least a section of the sidewalls of the member 406b (e.g., sidewalls at and near the base of the member 406b). In some embodiments, at least a section of the sidewalls of the member 406a (e.g., sidewalls at and near the base of the member 406a) may be substantially parallel to at least a section of the sidewalls of the member 406c (e.g., sidewalls at and near the base of the member 406c).

Figure 5:
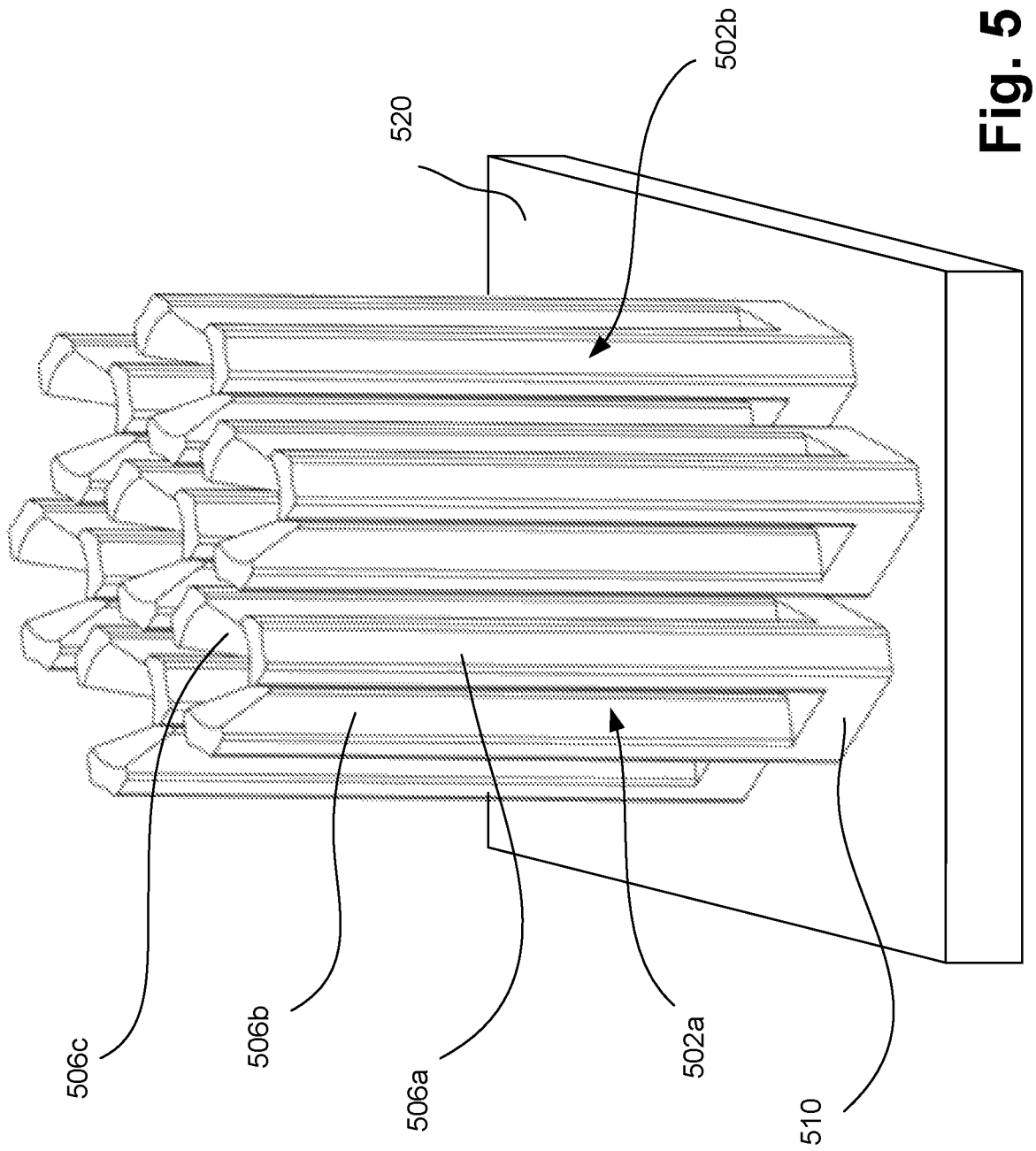
FIG. 5 illustrates a plurality of multi-member test probes attached to a test card, where bases on various members of a probe are attached to a common structure, and where the members are substantially perpendicular to the test card, according to some embodiments.

FIG. 5 illustrates a plurality of multi-member test probes 502 attached to a test card 520, where the bases on various members of a probe 502 are attached to a common structure, and where the members are substantially perpendicular to the test card 520, according to some embodiments. Although a plurality of probes 502 are illustrated, only two probes 502a and 502b are labelled in FIG. 5.

In some embodiments, the probe 502a may be similar to the probe 202a of FIGS. 2A-2F, and the discussion with respect to FIGS. 2A-2F may be applicable to the probe 502a of FIG. 5. For example, similar to the probe 202a, the probe 502a may include members 506a, 506b, and 506c. Furthermore, as discussed with respect to FIGS. 2E-2F and 4A-4B, the tips of the members may be chamfered, e.g., to accommodate an interconnect structure within the chamfered sidewalls of the members of a probe 502. In some embodiments, the bases of the members 506a, 506b, and 506c may be attached to a common structure 510, which may be attached to the test card 520 (e.g., to a contact pad of the test card, where the contact pad is not illustrated in FIG. 5).

In some embodiments, unlike FIGS. 2A-2F, the members 506a, 506b, 506c may be substantially perpendicular to the test card 520 (e.g., at the bases of the respectively members). For example, sidewalls of the member 506a (e.g., sidewalls at least near the common structure 510) may be at about 90 degrees with respect to a top surface of the common structure 510, and the top surface of the common structure 510 may be parallel to a top surface of the test card 520. In some embodiments, when an interconnect structure is inserted within the tips of the members 506a, 506b, 506c, the tip of the members may deflect outwards, e.g., as discussed with respect to FIG. 4B.

Some examples associated with FIGS. 1A-5 assume that the probes are attached to a test card. However, in some examples, the probes may be attached to the test card via one or more intervening layers. Merely as an example, the probes may be attached to a substrate. The substrate may be attached to a space transformer layer. The space transformer layer may be electrically coupled to the test card. In another example, there may be even more (or less) layers between the probes and the test cards.

Figure 6:
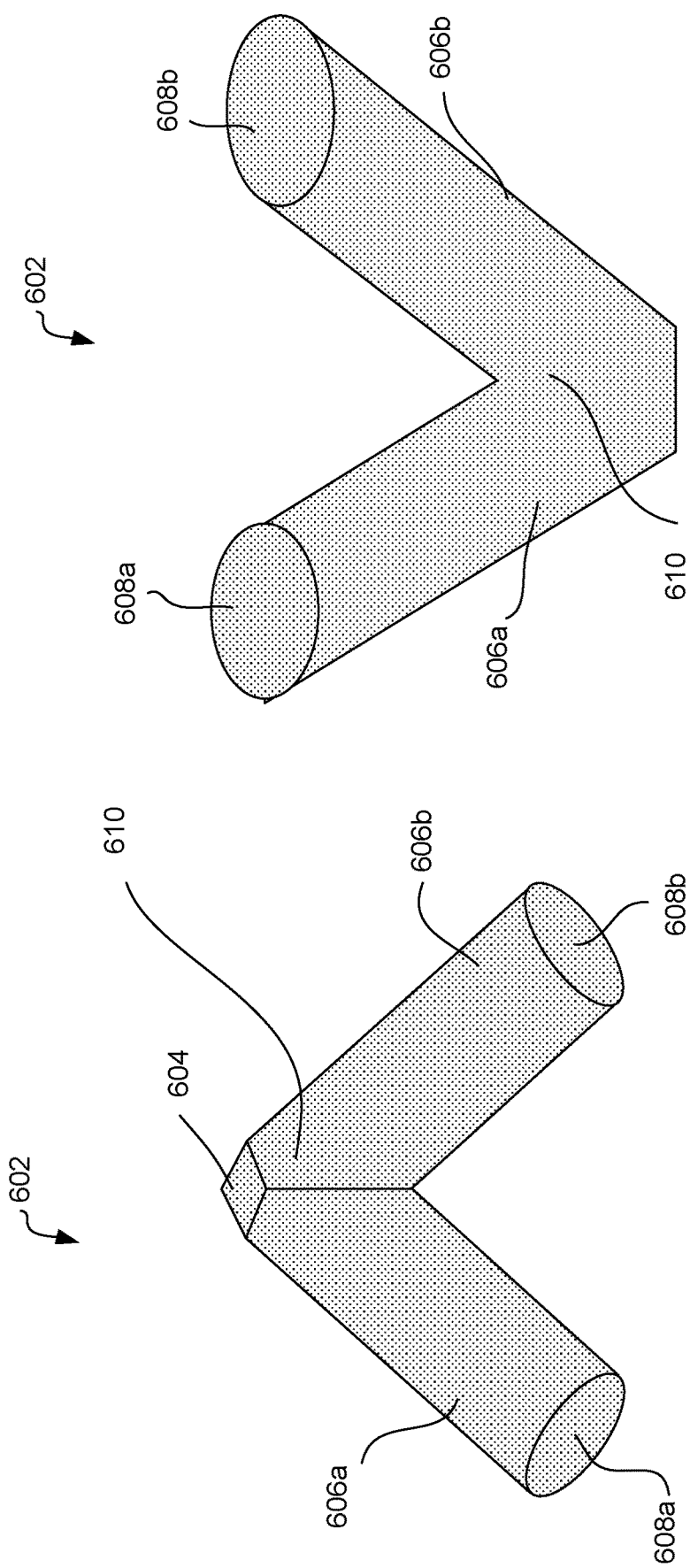
FIGS. 6A and 6B illustrate a two-member dipod shaped test probe, according to some embodiments.

FIGS. 1A-5 illustrate probes having tripod shape (e.g., with each probe including three members). A probe can also have any different number of members, e.g., two, four, five, or higher. For example, FIGS. 6A and 6B illustrate a two-member dipod shaped test probe 602, according to some embodiments.

In some embodiments, the probe 602 has two members, e.g., members 606a and 606b. In an example, the probe 602 may have a shape of a dipod, with the members 606a and 606b forming two legs or two beams of the dipod. The legs of the probe 602 (e.g., the members 606) may be attached to a common node 610 of the probe 602. Thus, each member 606 has a first end or a base attached to the node 610, and a tip that is at an opposite end of the base. A bottom surface of a member 606 at the tip of the member is labeled as 608.

FIG. 6A illustrates a top surface 604 of the probe 602, which may be the top surface of the node 610. In some embodiments, the top surface 604 may be coupled to a test card (not illustrated in FIGS. 3A-3B). Further details of the probe 602 (or appropriate modification to the probe 602) may be evident to those skilled in the art, based on the discussions with respect to FIGS. 1A-5. Accordingly, the probe 602 is not discussed in further details herein.

In some embodiments, various probes discussed with respect to FIGS. 1A-6B may have vertical structures or members that may be as tall as 500 microns, or smaller than 500 microns. The sidewalls and the dimensions of the probes may be optimized based on the specific application (e.g., arrangement and size of interconnection structures on the DUTs that are to be tested by these probes).

The probes may be scaled for 40 micron pitch or even lower pitch of the interconnect structures of the DUTs. For example, due to possibly short length of the members of the probes, radial positional error at the tip of the members may be relatively small, which may allow the use of the probes for sub-40 micron pitch of the interconnect structures of the DUTs.

The deflection of the tip of the members of the probes discussed herein (e.g., as discussed with respect to FIGS. 2D and 4D) may be adjustable, e.g., based on the length of the members, force applied, material used for the members, etc. In an example, force up to 1 g can be generated for a probe, with about 7.5 micron deflection at the tip.

In some embodiments, the probes discussed with respect to FIGS. 1A-6B may have robust current carrying capability, e.g., as the current of a probe during a test may be transmitted by multiple members of the probe in parallel to the interconnect structure of the DUT.

As will be discussed herein in further details, the probes may be manufactured using, for example, lithographic based process. Accordingly, extremely tight dimensional control of the probes may be possible, and neighboring probe interferences (e.g., a member of a probe accidentally contacting a member of an adjacent probe) may be reduced or eliminated. Also, contact forces of the probes may be distributed over multiple beams or members of the probe (e.g., instead of a single beam), thus buying margin against yielding and/or failing of the probes.

Figure 7:
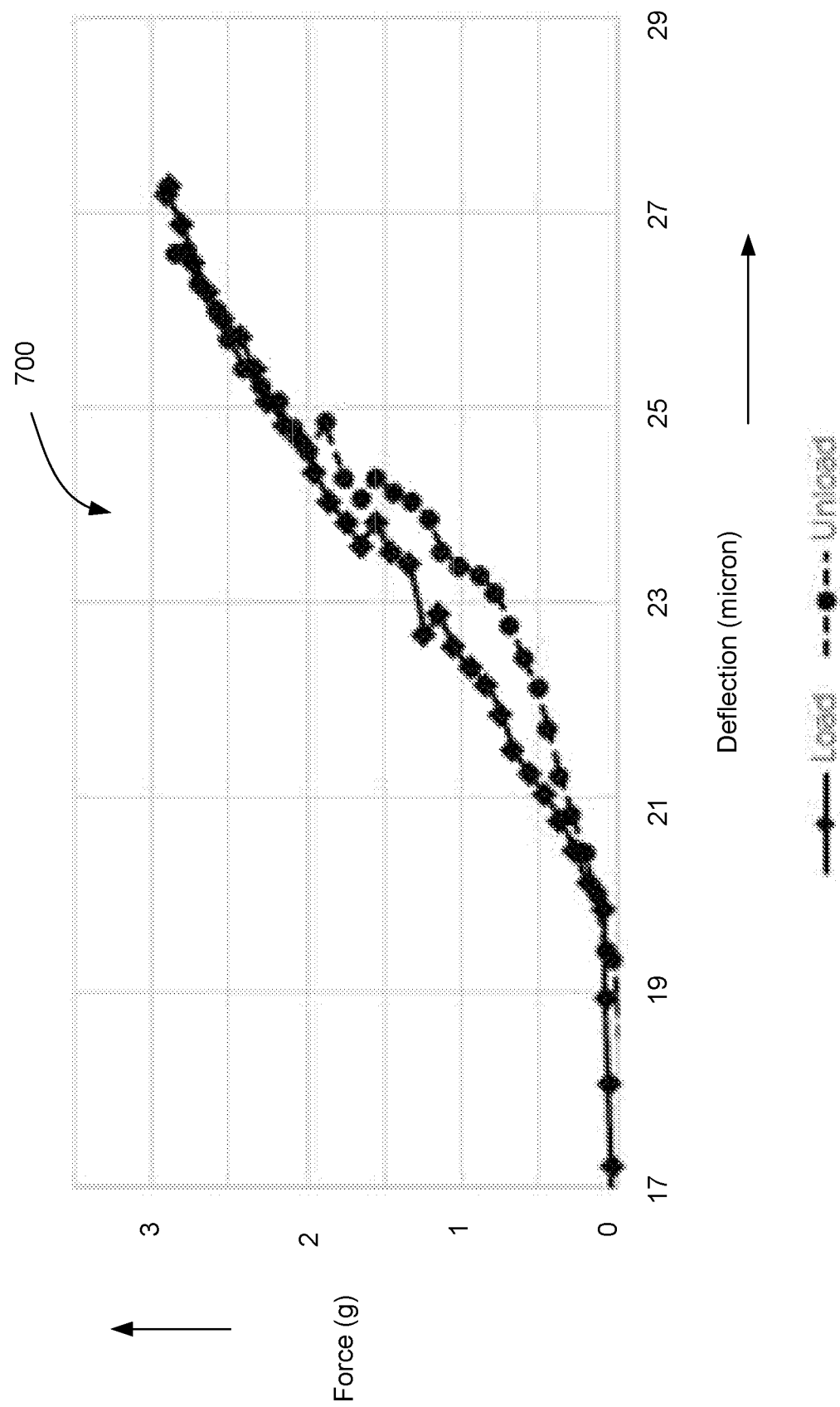
FIG. 7 illustrates a graph depicting an effect of force on a deflection of a tip of a member of a test probe, according to some embodiments.

FIG. 7 illustrates a graph 700 depicting an effect of force on a deflection of a tip of a member of a test probe (e.g., any of the test probes discussed with respect to FIGS. 1A-6B), according to some embodiments. The X axis of the graph 700 illustrates the deflection or over-travel (OT) (e.g., measured in microns) in of the tip of a member of a test probe, and the Y axis illustrates the force applied to cause the deflection. In an example, the probe has a nominal distance (e.g., distance without any interconnect structure of a DUT in between the members, such as distance d1 of FIG. 2D) of about 25 microns between tips of two members of the probe. The deflection of the tip (e.g., difference between distances d2 and d1 of FIG. 2D) is measured as force is applied (e.g., by inserting an interconnect structure or a similar structure within the tips of the members of the probe). The points in the graph 700 represent deflections during loading and unloading of the probe. As seen, with an increase of the force, the deflection of the tips increase.

FIG. 8A-8H illustrate example processes for formation of a plurality of multi-member probes on a test card comprising a substrate 801, according to some embodiments. For example, FIGS. 8A-8H are cross-sectional views of the substrate 801 and the probes evolving as example operations for formation of the probes are performed. Although the probes formed using FIGS. 8A-8H have two members each (e.g., similar to FIGS. 6A-6B), the discussion with respect to FIGS. 8A-8H can be applied to form probes having three members, four members, or even more.

Referring to FIG. 8A, illustrated is a substrate 801 of a test card. The substrate 801 can be a surface of the test card, on which the probes are to be formed. In some embodiments, a layer of photoresist material 803 may be formed on the substrate. In some embodiments, the photoresist material 803 may be negative photoresist, e.g., that has strong mechanical properties when exposed. For example, a negative photoresist is a type of photoresist in which the portion of the photoresist that is exposed to light becomes insoluble to photoresist developer. The unexposed portion of the photoresist can be dissolved by the photoresist developer. An example of negative photoresist used for the photoresist material 803 may be SU-8, which may be an epoxy-based negative photoresist. Any other appropriate type of negative photoresist material (e.g., an appropriate polymer or epoxy) may also be used.

Referring now to FIG. 8B, a mask 805 may be located on the photoresist material 803. The mask 805 may have openings 807 (e.g., openings 807a, 807b, and 807c). In an example, an opening 807 may be located where the base of a corresponding probe is to be eventually placed. In an example, a number of openings 807 (and locations of the openings 807) may correspond to a number of probes (and locations of the probes) that are to be formed.

Figure 8C:
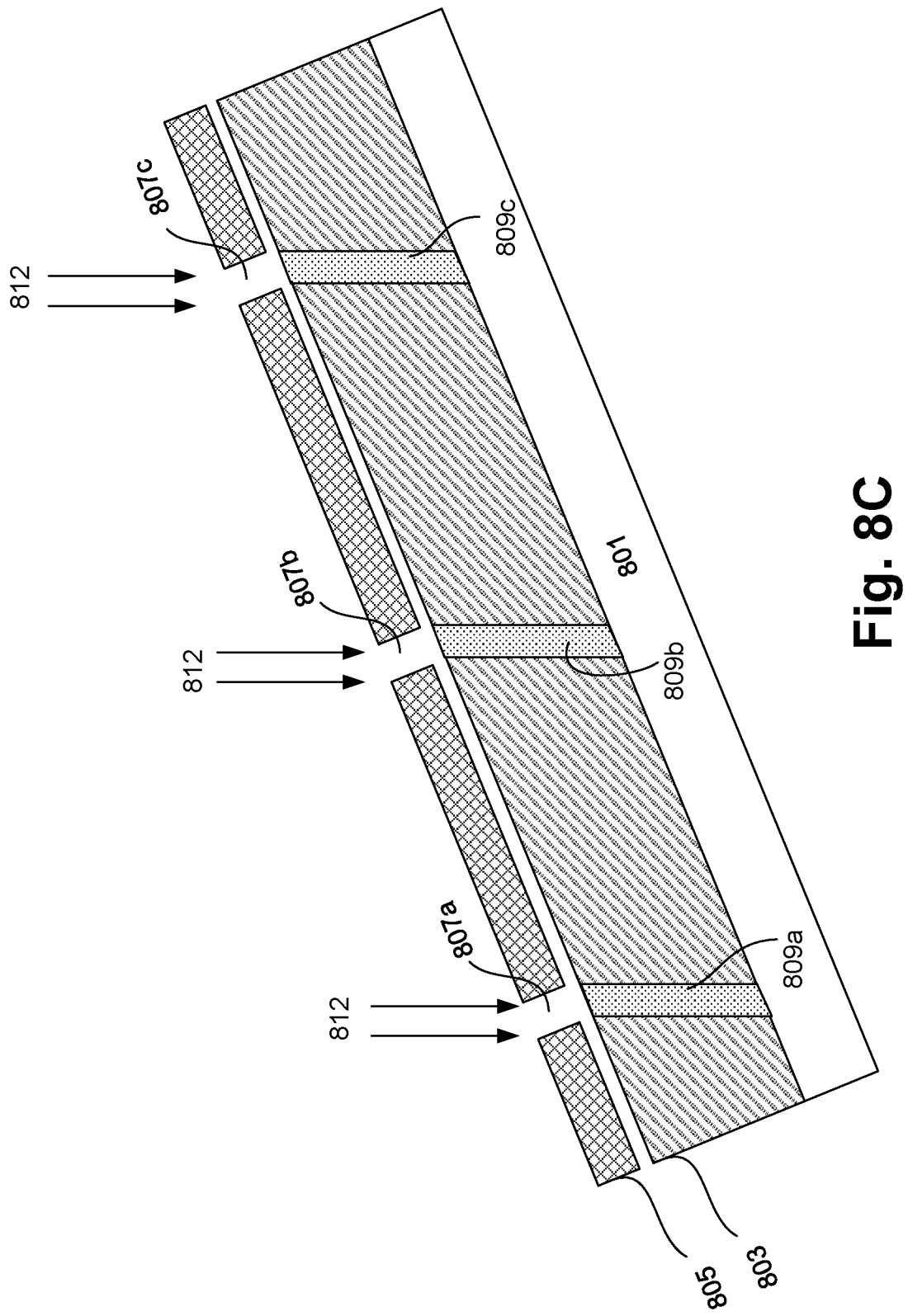

Referring now to FIG. 8C, the substrate 801, along with the photoresist material 803 and the mask 805, may be partially rotated or tilted. For example, the substrate 801 may be placed on a tilt or rotation stage, and rotated or tilted. An angle of rotation or tilt may be based on a desired angle at which a member of the probe to be formed is to be with respect to the substrate 801. Subsequently, the substrate 801, along with the photoresist material 803 and the mask 805, may be placed under one or more ultraviolet light (UV) sources. For example, the photoresist material 803 may be exposed to light 812 through the openings 807.

In some other embodiments, instead of, or in addition to, rotating the substrate 801 and the layers thereon, the direction of the light 812 may also be rotated or tilted with respect to the substrate 801 (e.g., in a manner that is complimentary to the rotation or tilt of the substrate 801). Thus, the rotation of the substrate 801 and the layers thereon and/or the rotation of the light source may be such that the light 812 is directed at an angle towards the opening.

As the photoresist material 803 is a negative photoresist material, the exposed portions of the photoresist material 803 may harden and have strong mechanical properties (e.g., may form stiff polymer), which may become insoluble to photoresist developer. For example, the exposed photoresist material 803, e.g., exposed through the openings 807a, 807b, and 807c, may form cores 809a, 809b, and 809c, respectively.

Figure 8D:
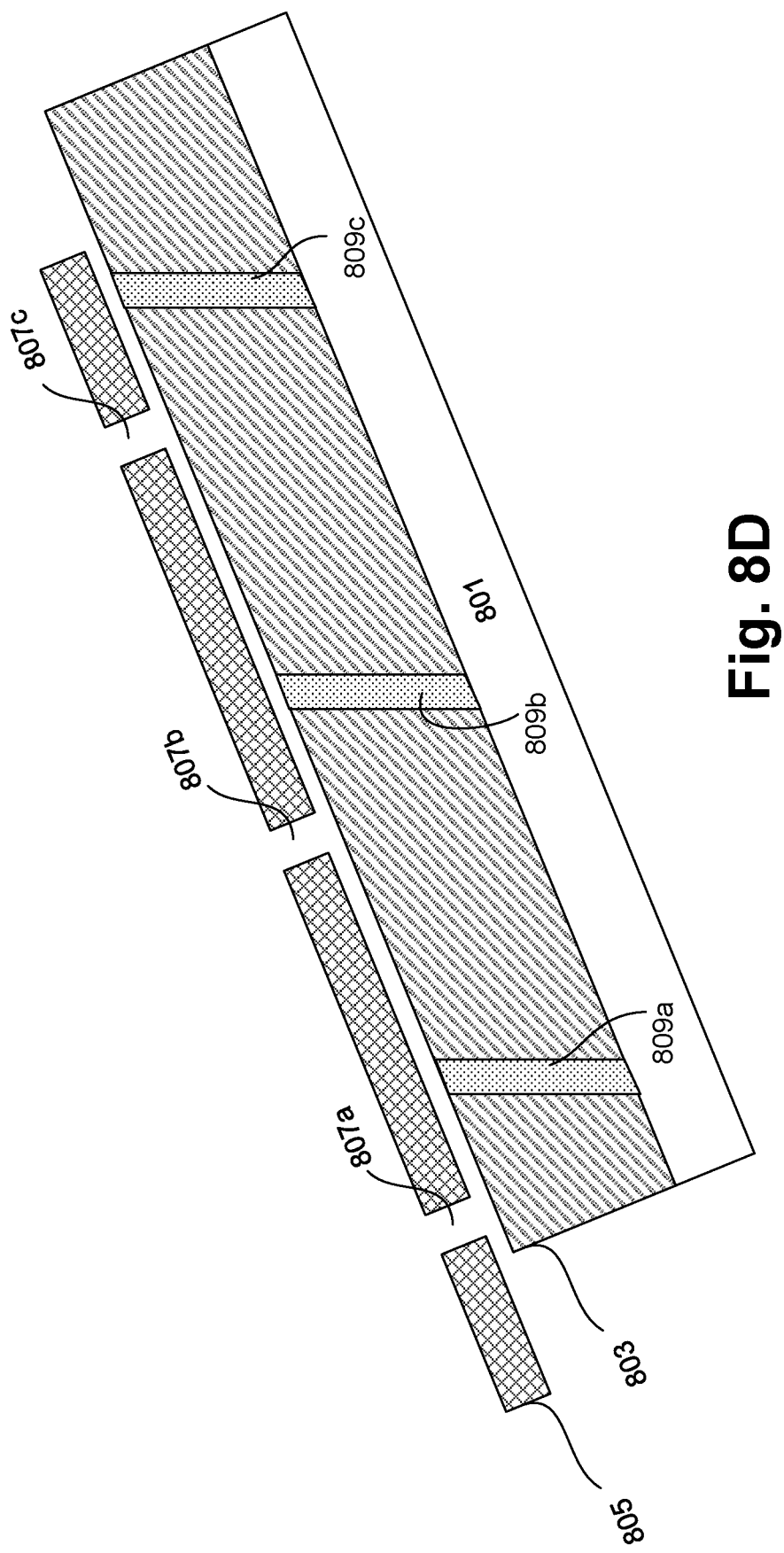

Referring now to FIG. 8D, the mask 805 may be shifted, thereby shifting the openings 807 with respect to the substrate 801. The amount by which the mask 805 may be shifted may be based on locations of members of the probes, the desired angle at which a member of a probe to be formed is to be with respect to the substrate 801, etc.

Figure 8E:
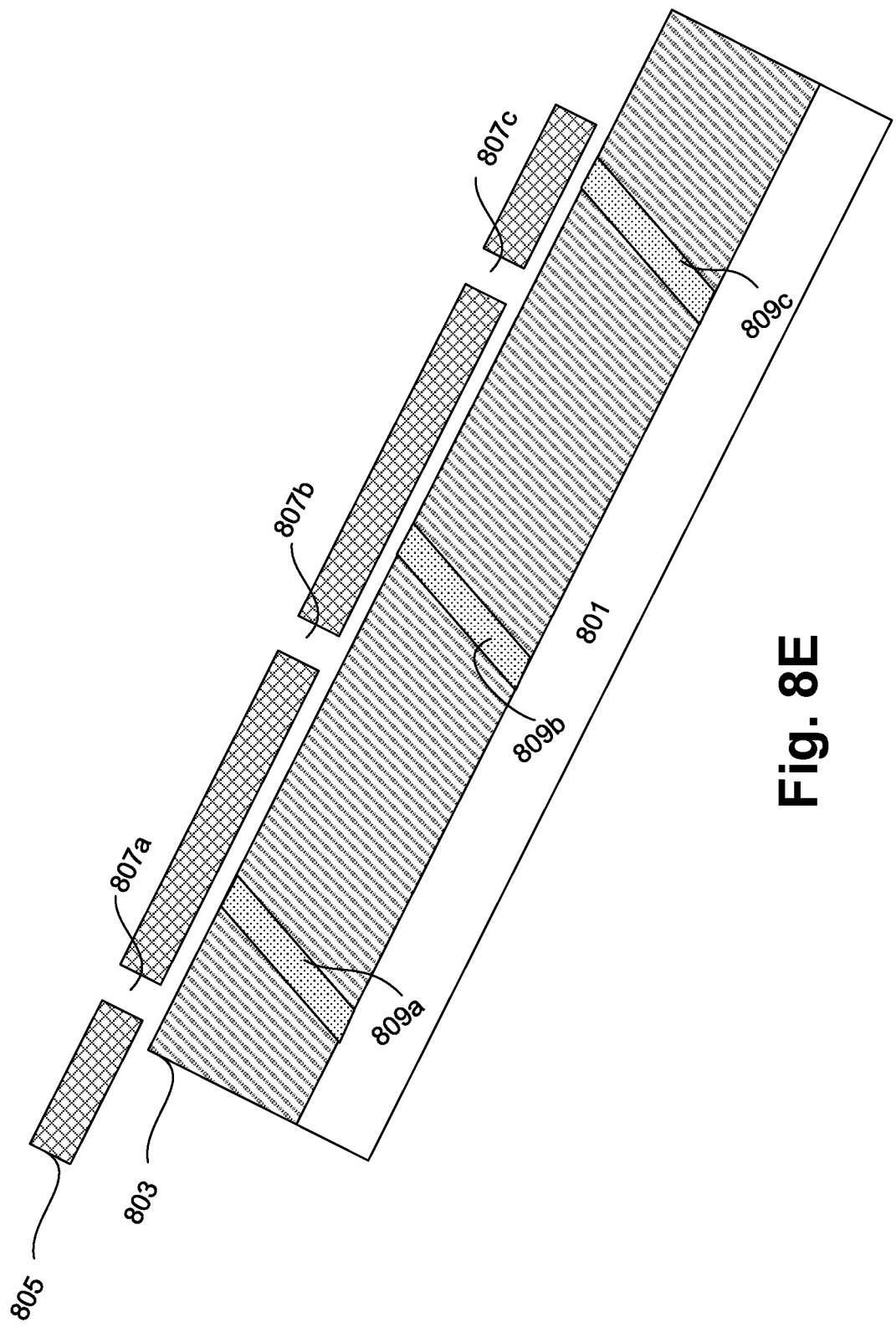

Referring now to FIG. 8E, the substrate 801, along with the photoresist material 803 and the shifted mask 805, may be again partially rotated or tilted (e.g., in a direction that is opposite to the direction of initial rotation in FIG. 8C). For example, assuming that a symmetrical dipod shaped probe (e.g., similar to FIGS. 6A-6B) is to be formed, if the substrate 801 in FIG. 8C was at a +C angle with respect to the horizon, the substrate 801 in FIG. 8E may be rotated to −C angle with respect to the horizon.

Figure 8F:
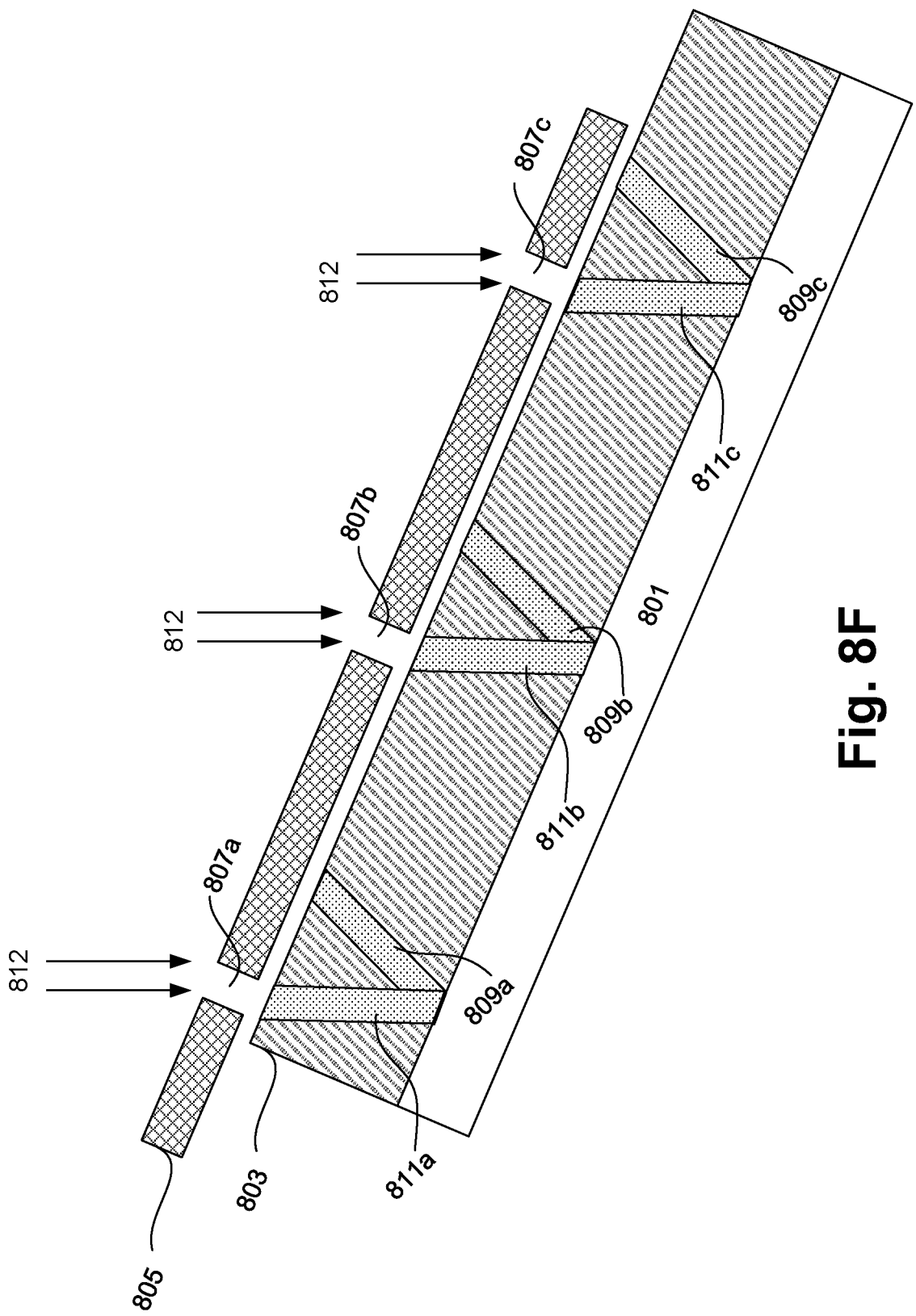

Referring now to FIG. 8F, the substrate 801 may be placed under the one or more UV sources. In some other embodiments, instead of, or in addition to, rotating the substrate 801 and the layers thereon in FIG. 8E, the direction of the light 812 may also be rotated or tilted with respect to the substrate 801 (e.g., in a manner that is complimentary to the rotation or tilt of the substrate 801). Thus, the rotation of the substrate 801 and the layers thereon and/or the rotation of the light source may be such that the light 812 is directed at an angle towards the opening.

Referring again to FIG. 8F, for example, the photoresist material 803 may be exposed again to the light 812 through the openings 807. As the photoresist material 803 is a negative photoresist material, the exposed portions of the photoresist material 803 may harden and have strong mechanical properties (e.g., may form stiff polymer), which may become insoluble to photoresist developer. For example, the exposed photoresist material 803, e.g., exposed through the openings 807*a*, 807*b*, and 807*c*, may now form cores 811*a*, 811*b*, and 811*c*, respectively.

Figure 8G:
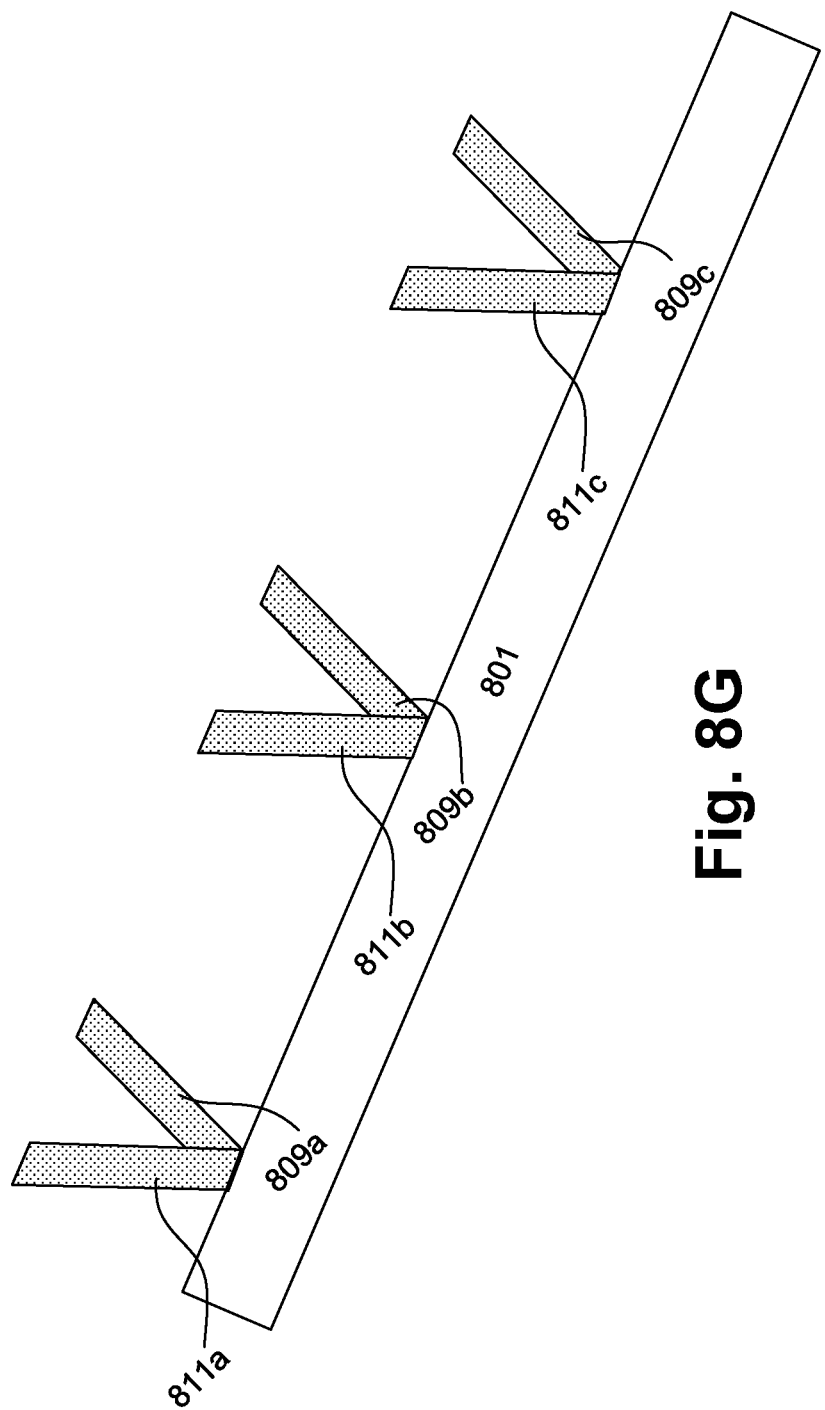

Referring now to FIG. 8G, the unexposed photoresist material 803 may be developed or washed away, and the cores 809 and 811 may remain.

Figure 8H:
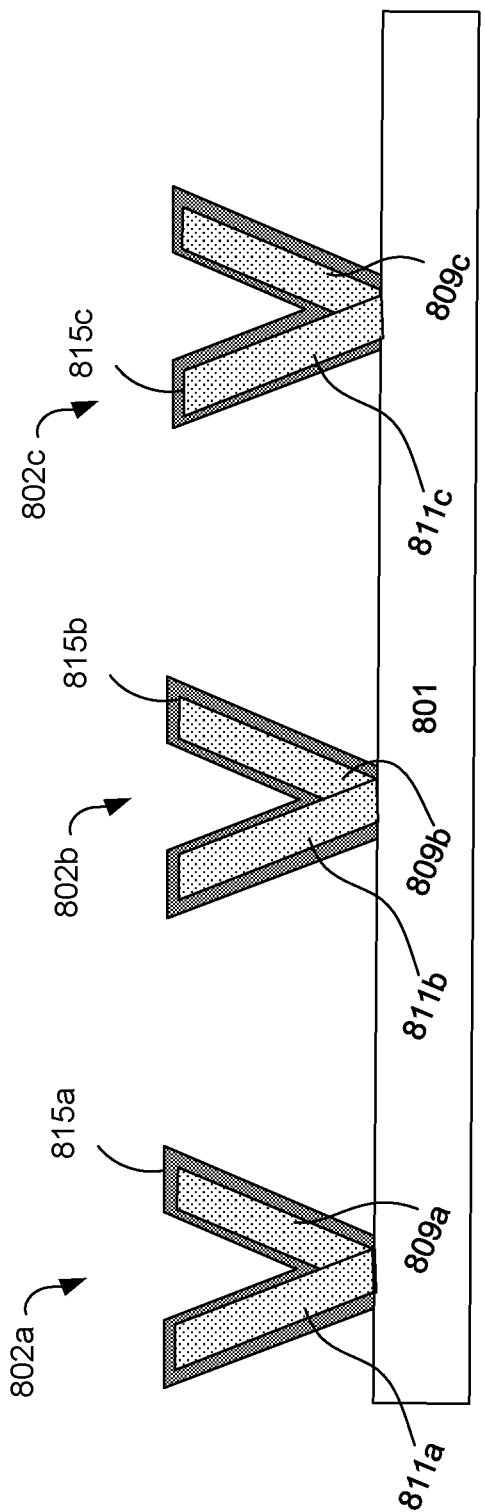

Referring now to FIG. 8H, conductive material 815*a* may be deposited over the cores 809*a* and 811*a*; conductive material 815*b* may be deposited over the cores 809*b* and 811*b*; and conductive material 815*c* may be deposited over the cores 809*c* and 811*c*. Any appropriate deposition process may be employed, e.g., a physical vapor deposition (PVD) process, followed by an electroforming (e.g., electroplating) process, e.g., depending on a desired thickness of the deposit. Any appropriate conductive material may be used, e.g., one or more metals, one or more metal alloys, Tungsten, Nickel, Copper, Aluminum, Silver, Silver alloy, Nickel and Cobalt based alloys, and/or the like. In FIG. 8G, a thickness of conductive material 815 is illustrated to be somewhat less than the thicknesses of the cores 809 and 811—however, the thicknesses of the conductive materials 815, the cores 809, and/or the cores 809 illustrated in FIG. 8G are merely examples, and do not limit the scope of this disclosure.

In some embodiments, the cores 809*a*, 811*a*, and the conductive material 815*a* thereon may form a probe 802*a*. For example, the core 809*a* may form a skeletal structure or a core of a member of the probe 802*a*, and the conductive material 815*a* on the core 809*a* may form an outer conductive layer of the member. Similarly, the core 811*a* may form a skeletal structure or a core of another member of the probe 802*a*, and the conductive material 815*a* on the core 811*a* may form an outer conductive layer of the another member. Similarly, other probes 802*b* and 802*c* may also be formed. In an example, the probes 802 may be similar to the probe 602 discussed with respect to FIGS. 6A-6B.

Although FIGS. 8A-8H illustrate formation of three probes 802*a*, 802*b*, and 802*c* on the substrate 801 of a test card, a larger number of probes may also be formed using similar process. Although FIGS. 8A-8H illustrate formation of probes having two members each (e.g., a dipod structure), probes with three or more members may also be formed. For example, after the formation of the cores 811 in FIG. 8F, the mask 805 may be shifted or realigned again and substrate 801 may be rotated again, followed by another exposure, e.g., to form a third set of cores for each probe. This process may be repeated again for even higher number of cores.

In FIGS. 8A-8H, probes are formed having members that have polymer at the core and conductive material (e.g., metal) on the surface. In contrast, FIGS. 9A-9H illustrate example processes for formation of a plurality of multi-member probes on a test card comprising a substrate 901, where the members of the probes comprise conductive material (and no polymer cores), according to some embodiments. For example, FIGS. 9A-9H are cross-sectional views of the substrate 901 and the probes evolving as example operations for formation of the probes are performed.

Referring to FIG. 9A (and at least in part similar to FIG. 8A), illustrated is a substrate 901 of a test card. In some embodiments, a layer of photoresist material 903 may be formed on the substrate. In some embodiments (and unlike the photoresist material 803 of FIG. 8A), the photoresist material 903 may be positive photoresist. For example, in a positive resist material, portions of the photoresist that is exposed to light becomes soluble to the photoresist developer. The unexposed portion of the photoresist remains insoluble to the photoresist developer.

Referring now to FIG. 9B, a mask 905 may be located on the photoresist material 903. The mask 905 may have openings 907 (e.g., openings 907*a*, 907*b*, and 907*c*), similar to FIG. 8B.

Figure 9C:
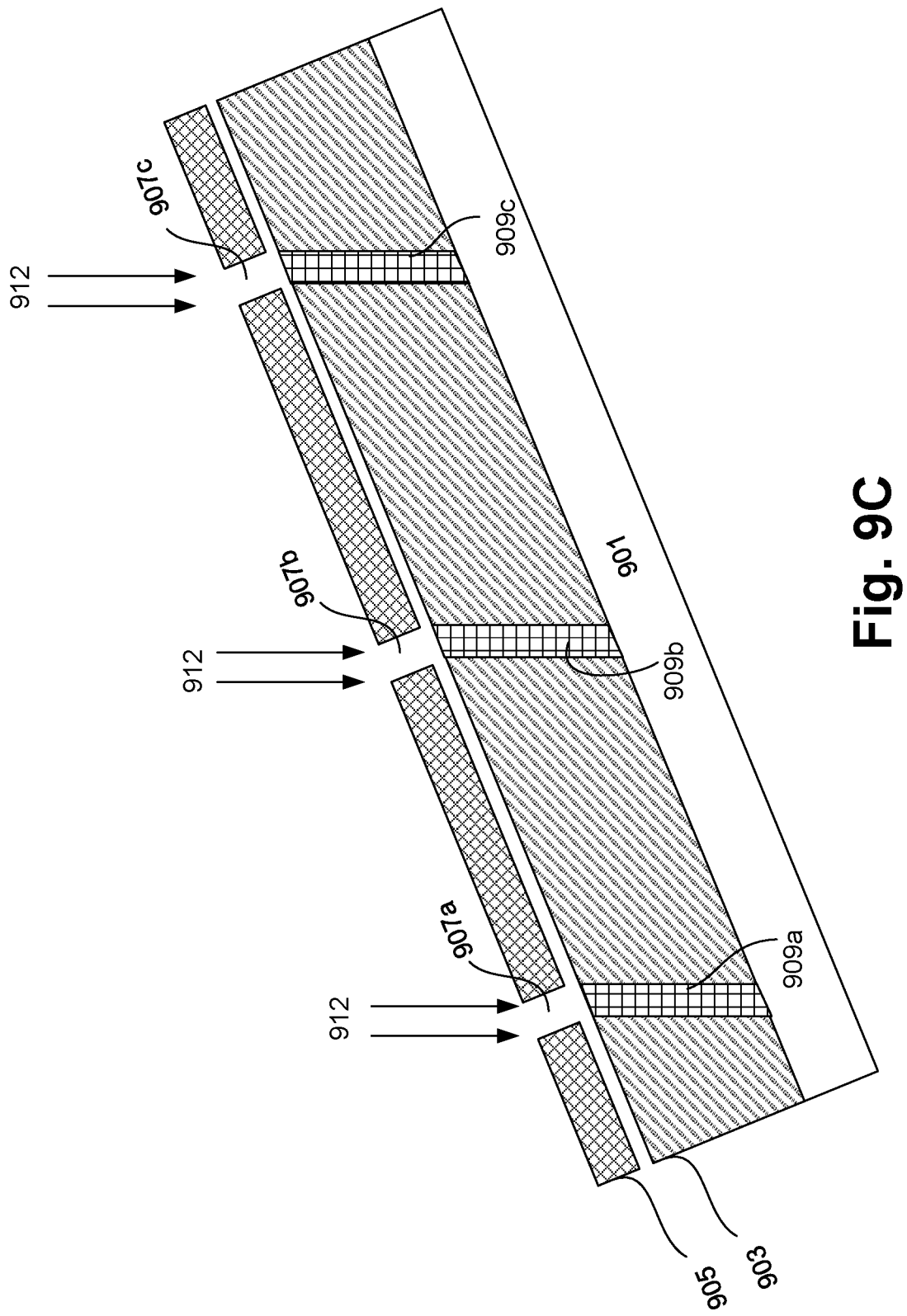

Referring now to FIG. 9C, the substrate 901, along with the photoresist material 903 and the mask 905, may be partially rotated or tilted, and exposed to light 912 through the openings 907 (e.g., similar to FIG. 8C). As the photoresist material 903 is a positive photoresist material, the exposed portions of the photoresist material 903 may form members 909*a*, 909*b*, 909*c*, where the members 909 may become soluble to photoresist developer.

Figure 9D:
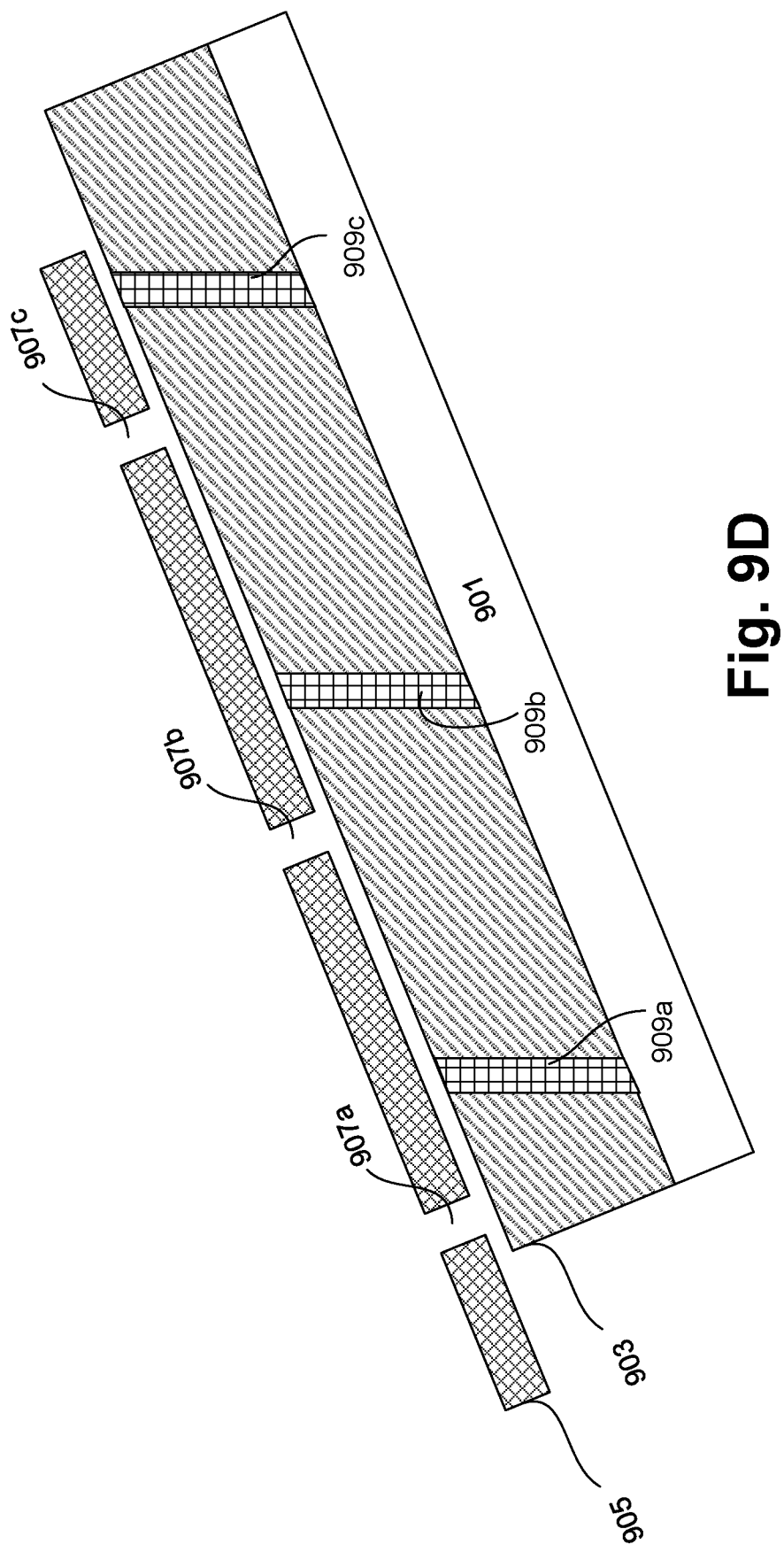
Figure 9E:
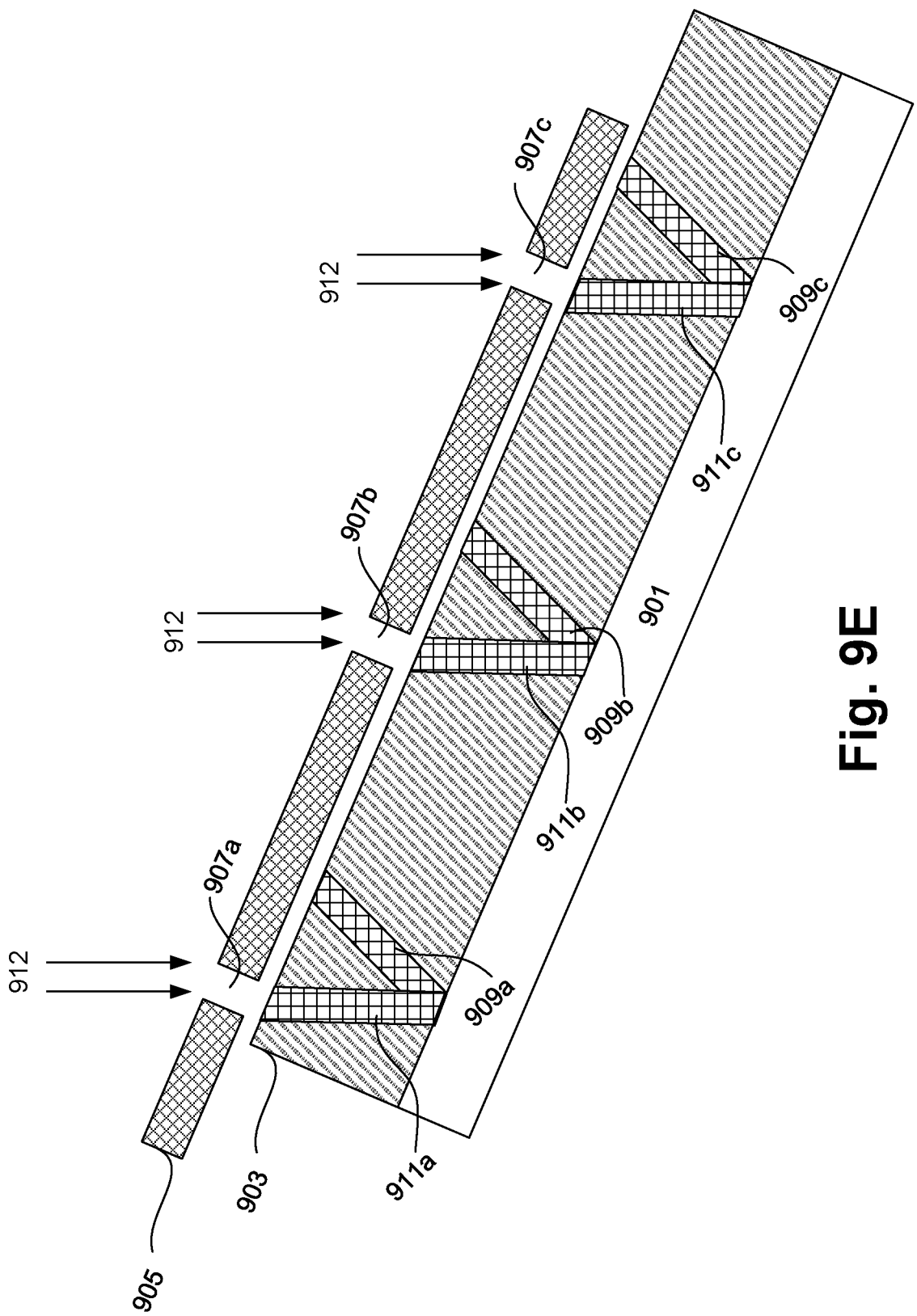

Referring now to FIG. 9D, the mask 905 may be shifted, thereby shifting the openings 907 with respect to the substrate 901 (e.g., similar to FIG. 8D). Referring now to FIG. 9E, the substrate 901, along with the photoresist material 903 and the mask 905, may be again partially rotated or tilted, e.g., in a direction that is opposite to the direction of initial rotation in FIG. 9C (e.g., similar to FIG. 8E). Also at FIG. 9E, the photoresist material 903 may be exposed again to light 912 through the openings 907. As the photoresist material 903 is a positive photoresist material, the exposed portions of the photoresist material 903 may form members 911*a*, 911*b*, 911*c*, where the members 911 may become soluble to photoresist developer.

Referring now to FIG. 9F, the mask 905 may be removed. Also, the exposed photoresist material 903 (e.g., the members 909 and 911) may be developed or washed away, and the unexposed photoresist material 903 may remain. Thus, removal of the members 909 and 911 may form molds or openings 913*a*, 913*b*, and 913*c* within the photoresist material 903.

Referring now to FIG. 9G, the opening 913*a* may be filled with conductive material to form members 915*a* and 917*a*; the opening 913*b* may be filled with conductive material to form members 915*b* and 917*b*; and the opening 913*c* may be filled with conductive material to form members 915*c* and 917*c*. In some embodiments, the conductive material may be deposited within the openings 913 using any appropriate deposition process, e.g., plating (e.g., electroplate or electroless), physical vapor deposition (PVD) process, and/or the like. In some embodiments, the members 915 and 917 may be planarized, e.g., using a chemical-mechanical planarization (CMP) process and/or the like. Any appropriate conductive material may be used for the members 915 and 917, e.g., one or more metals, one or more metal alloys, Tungsten, Nickel, Copper, Aluminum, Silver, Silver alloy, Nickel and Cobalt based alloys, and/or the like.

Referring now to FIG. 9H, the unexposed and remaining photoresist material 903 may be developed and washed away, leaving the conductive material members 915 and 917. For example, the members 915a and 917a may form a probe 902a, the members 915b and 917b may form a probe 902b, and the members 915c and 917c may form a probe 902c. The probes 902 may be similar to the probe 602 discussed with respect to FIGS. 6A-6B.

In FIGS. 8A-9H, the probes 802 have members that have polymer at the core and conductive material (e.g., metal) on the surface. In contrast, the probes 902 of FIGS. 9A-9H do not have a polymer core—rather, the probes 902 comprise conductive material such as metal.

Although FIGS. 9A-9H illustrate formation of three probes 902a, 902b, and 902c on the substrate 901 of a test card, a larger number of probes may also be formed using similar process. Although FIGS. 9A-9H illustrate formation of probes having two members each (e.g., dipod structure), probes with three or more structures may also be formed. For example, after the formation of the members 911 in FIG. 9E, the mask 905 may be shifted or realigned again and substrate 901 may be rotated gain, followed by another exposure, e.g., to form a third set of members for each probe. This process may be repeated again for even higher number of cores.

Figure 10:
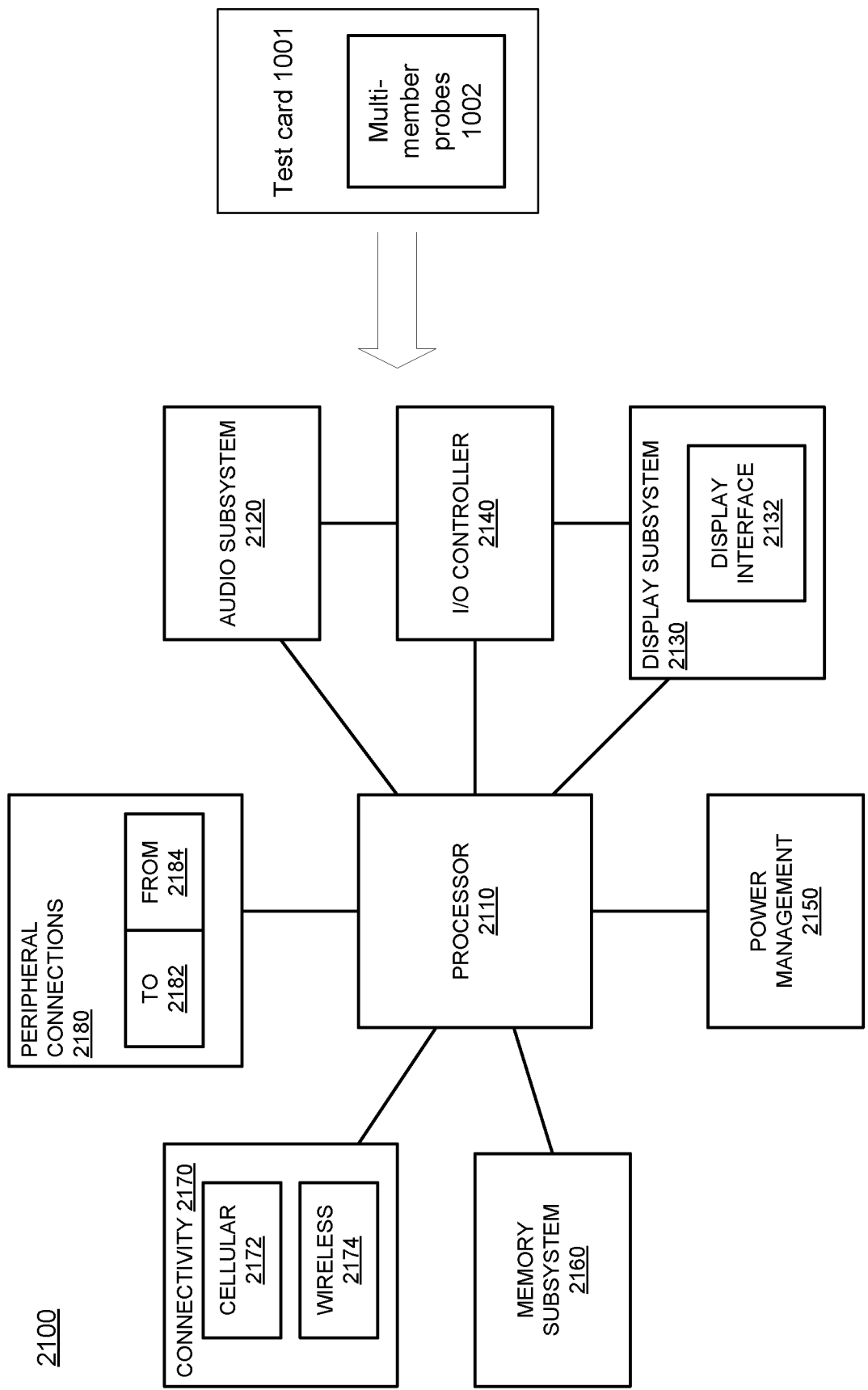
FIG. 10 illustrates a computing device or a SoC (System-on-Chip) comprising a test card and one or more multi-member test probes, according to some embodiments.

FIG. 10 illustrates a computing device or a SoC (System-on-Chip) 2100 comprising a test card 1001 and one or more multi-member probes 1002, according to some embodiments. It is pointed out that those elements of FIG. 10 having the same reference numbers (or names) as the elements of any other figure can operate or function in any manner similar to that described, but are not limited to such.

In some embodiments, computing device 2100 represents an appropriate computing device, such as a computing tablet, a mobile phone or smart-phone, a laptop, a desktop, an IOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem 2152 to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, the computing device 2100 may be used to test various DUTs, e.g., the DUT 201 of FIG. 2A. The test card 1001 may correspond to any of the test cards discussed herein (e.g., test card 220). The multi-member probes 1002 may correspond to any probe discussed herein with respect to FIGS. 1A-9F. In an example, the computing device 2100 may include a testing arrangement to test one or more DUTs, where a testing arrangement may include the test card 1001 and the multi-member test probes 1002. In an example, the processors 2110 may control testing of the DUTs, e.g., by controlling operations of the test cards 1001.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1. A testing arrangement for testing Integrated Circuit (IC) interconnects, the testing arrangement comprising: a substrate; and a first interconnect structure comprising: a first member having a first end to attach to the substrate and a second end opposite the first end, and a second member having a first end to attach to the substrate and a second end opposite the first end, wherein the second end of the first member and the second end of the second member are to contact a second interconnect structure of a IC device under test, and wherein the first end of the first member and the first end of the second member are coupled such that the first member and the second member are to transmit, in parallel, current to the second interconnect structure of the IC device under test.

Example 2. The testing arrangement of example 1 or any other example, wherein: the first end of the first member and the first end of the second member are attached at a node; and the node is attached to the substrate.

Example 3. The testing arrangement of example 1 or any other example, wherein the substrate comprises: a conductive pad, wherein the first end of the first member and the first end of the second member are attached to the conductive pad.

Example 4. The testing arrangement of example 1 or any other example, wherein: the second end of the first member and the second end of the second member define a space; and the second interconnect structure of the device under test is to be inserted within the space.

Example 5. The testing arrangement of example 4 or any other example, wherein: the first member and the second member are to deflect upon contact with the second interconnect structure of the device under test, such that the space defined by the second end of the first member and the second end of the second member is to increase upon the contact.

Example 6. The testing arrangement of any of examples 1-5 or any other example, wherein: the first member comprises: a first surface at the first end attached to the substrate, a second surface at the second end opposite the first surface, and one or more sidewalls between the first surface and the second surface; and a portion of a sidewall of the one or more sidewalls is to contact the second interconnect structure of the device under test.

Example 7. The testing arrangement of any of examples 1-5 or any other example, wherein the first interconnect structure further comprises: a third member having a first end attached to the substrate and a second end opposite the first end, wherein the second end of the third member is to contact the second interconnect structure of the device under test.

Example 8. The testing arrangement of any of examples 1-5 or any other example, wherein the first member comprises: a core comprising a non-conductive material; and a conductive material on the core.

Example 9. The testing arrangement of example 8 or any other example, wherein: the non-conductive material comprises one or more of: a polymer, a negative photoresist material, or SU-8 material; and the conductive material comprises one or more metals.

Example 10. The testing arrangement of any of examples 1-5 or any other example, wherein the first member comprises: one or more metals.

Example 11. The testing arrangement of any of examples 1-5 or any other example, wherein the second end of the first member and the second end of the second member are chamfered to accommodate the second interconnect structure of the device under test.

Example 12. The testing arrangement of any of examples 1-4 or any other example, wherein the testing arrangement further comprises: a third interconnect structure comprising: a third member having a first end attached to the substrate and a second end opposite the first end, and a fourth member having a first end attached to the substrate and a second end opposite the first end, wherein the second end of the third member and the second end of the fourth member are to contact a fourth interconnect structure of the device under test.

Example 13. The testing arrangement of any of examples 1-5 or any other example, wherein: at least a part of the first member is substantially parallel to at least a part of the second member.

Example 14. A system comprising: a memory to store instructions; a processor coupled to the memory, the processor to execute the instructions to test a device under test (DUT); and a plurality of probes attached to a substrate, wherein a probe of the plurality of probes comprises a plurality of members, wherein individual members of the plurality of members comprises a first end attached to the substrate and a second end opposite the first end, wherein the second ends of the plurality of members of the probe define a space, and wherein the space defined by the second ends of the plurality of members is to receive an interconnect structure of the DUT.

Example 15. The system of example 14 or any other example, wherein: one or more of the plurality of members are to deflect upon contact with the interconnect structure of the DUT, such that the space defined by the second ends of the plurality of members is to increase upon the contact.

Example 16. The system of any of examples 14-15 or any other example, wherein: the plurality of members is arranged in one of a dipod structure, a tripod structure, or a quadpod structure.

Example 17. A method comprising: forming a photoresist material over a substrate; and forming a first member and a second member of a probe on the substrate, wherein forming the first member and the second member comprises: forming a mask on the photoresist material, the mask comprising an opening, first exposing a first section of the photoresist material to a light source through the opening, while the substrate is at a first angle with respect to the light source, shifting the mask relative to the substrate, and second exposing a second section of the photoresist material to the light source through the opening, while the substrate is at a second angle with respect to the light source and subsequent to shifting the mask.

Example 18. The method of example 17 or any other example, wherein forming the first member and the second member comprises: selectively removing the photoresist layer, without removing the first and second sections of the photoresist material; and depositing metal on the first and second sections of the photoresist material to respectively form the first member and the second member.

Example 19. The method of example 18 or any other example, wherein: the first member comprises the first section of the photoresist material and the metal deposited thereon; and the second member comprises the second section of the photoresist material and the metal deposited thereon.

Example 20. The method of any of examples 18-19 or any other example, wherein the photoresist layer is a negative photoresist material.

Example 21. The method of example 17 or any other example, wherein forming the first member and the second member comprises: selectively removing the first and second sections of the photoresist material to respectively form a first opening and a second opening in the photoresist material; and depositing metal in the first and second openings to respectively form the first member and the second member.

Example 22. The method of example 21 or any other example, wherein forming the first member and the second member comprises: removing remaining photoresist material, wherein the first member and the second member comprises the metal.

Example 23. The method of any of examples 21-22 or any other example, wherein the photoresist layer is a positive photoresist material.

Example 24. A testing interconnect structure comprising: a first beam having a first end attached to a substrate and a second end opposite the first end; and a second beam having a first end attached to the substrate and a second end opposite the first end, wherein the second end of the first member and the second end of the second member are to pinch an interconnect structure of a device under test.

Example 25. The testing interconnect structure of example 24 or any other example, wherein the first end of the first beam and the first end of the second beam are coupled such that the first beam and the second beam are to transmit, in parallel, current to the interconnect structure of the device under test.

Example 26. An apparatus comprising: means for performing the method of any of the examples 17-23 or any other example.

Example 27. An apparatus comprising: means for forming a photoresist material over a substrate; and means for forming a first member and a second member of a probe on the substrate, wherein the means for forming the first member and the second member comprises: means for forming a mask on the photoresist material, the mask comprising an opening, means for first exposing a first section of the photoresist material to a light source through the opening, while the substrate is at a first angle with respect to the light source, means for shifting the mask relative to the substrate, and means for second exposing a second section of the photoresist material to the light source through the opening, while the substrate is at a second angle with respect to the light source and subsequent to shifting the mask.

Example 28. The apparatus of example 27 or any other example, wherein the means for forming the first member and the second member comprises: means for selectively removing the photoresist layer, without removing the first and second sections of the photoresist material; and means for depositing metal on the first and second sections of the photoresist material to respectively form the first member and the second member.

Example 29. The apparatus of example 28 or any other example, wherein: the first member comprises the first section of the photoresist material and the metal deposited thereon; and the second member comprises the second section of the photoresist material and the metal deposited thereon.

Example 30. The apparatus of any of examples 28-29 or any other example, wherein the photoresist layer is a negative photoresist material.

Example 31. The apparatus of example 27 or any other example, wherein the means for forming the first member and the second member comprises: means for selectively removing the first and second sections of the photoresist material to respectively form a first opening and a second opening in the photoresist material; and means for depositing metal in the first and second openings to respectively form the first member and the second member.

Example 32. The apparatus of example 31 or any other example, wherein the means for forming the first member and the second member comprises: means for removing remaining photoresist material, wherein the first member and the second member comprises the metal.

Example 33. The apparatus of any of examples 31-32 or any other example, wherein the photoresist layer is a positive photoresist material.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An Integrated Circuit (IC) device testing apparatus, the apparatus comprising:
   a substrate; and
   a plurality of probes coupled to the substrate, wherein individual ones of the plurality comprise:
      a first probe member having a first end attached to the substrate and a second end opposite the first end; and
      a second probe member having a first end attached to the substrate and a second end opposite the first end, wherein the second end of the first member and the second end of the second member are to concurrently contact a single interconnect structure of an IC device under test.

2. The apparatus of claim 1, wherein:
   the first end of the first probe member and the first end of the second probe member are attached at a single node attached to the substrate.

3. The apparatus of claim 1, wherein the substrate comprises a conductive pad, and wherein the first end of the first probe member and the first end of the second probe member are attached to the conductive pad.

4. The apparatus of claim 1, wherein the second end of the first probe member and the second end of the second probe member define a space within which the interconnect structure is to be inserted.

5. The apparatus of claim 4, wherein:
   the first probe member and the second probe member are to undergo a deflection in response to a stress resulting from contact with the interconnect structure, the deflection to increase the space between the second end of the first probe member and the second end of the second probe member.

6. The apparatus of claim 1, wherein
   the first probe member comprises one or more sidewalls between the first end and the second end; and
   wherein a portion of the one or more sidewalls is to contact the interconnect structure.

7. The apparatus of claim 1, wherein individual ones of the plurality of probes further comprise a third probe member having a first end attached to the substrate and a second end opposite the first end, and wherein the second end of the third probe member is to contact the interconnect structure currently with the first and second probe members.

8. The apparatus of claim 1, wherein the first and second probe members each comprise:
   a core comprising a non-conductive material; and
   a conductive material on the core.

9. The apparatus of claim 8, wherein:
   the non-conductive material comprises one or more of: a polymer, a negative photoresist material, or SU-8 material; and
   the conductive material comprises one or more metals.

10. The apparatus of claim 1, wherein the second end of the first member and the second end of the second member are chamfered to accommodate an outside surface of the interconnect structure.

11. The apparatus of claim 1, wherein
the plurality of probes are dimensioned and spaced over the substrate to accommodate a plurality of the interconnect structures that have no more than a 40 micron pitch.

12. A system comprising:
a memory to store instructions;
a processor coupled to the memory, the processor to execute the instructions to test a device under test (DUT); and
a plurality of probes attached to a substrate, wherein individual ones of the plurality of probes comprises a plurality of probe members, each of the probe members having a first end attached to the substrate and a second end opposite the first end, wherein the second ends of the plurality of probe members of an individual one of the probes define a space within which a single interconnect structure of the DUT is to be received.

13. The system of claim 12, wherein one or more of the plurality of probe members are to undergo a deflection in response to a stress resulting from contact with the interconnect structure, the deflection to increase the space between the second ends of the probe members.

14. The system of claim 12, wherein:
the plurality of probe members are in one of a dipod structure, a tripod structure, or a quadpod structure.

15. The system of claim 12, wherein the plurality of probes are dimensioned and spaced over the substrate to accommodate a plurality of the interconnect structures that have no more than a 40 micron pitch.

16. A method of fabricating a plurality of electrical test probes, the method comprising:
forming a photoresist material over a substrate; and
forming a first probe member and a second probe member on the substrate for each of the plurality of electrical test probes, wherein forming the first probe member and the second probe member comprises:
exposing a first section of the photoresist material to a light source through a mask opening at a first angle of incidence, non-orthogonal to a plane of the substrate,
exposing a second section of the photoresist material to the light source through a mask opening at a second angle of incidence, non-orthogonal to the plane of the substrate, and non-parallel to the first angle of incidence; and
depositing metal over a sidewall of features defined in the photoresist by the exposing.

17. The method of claim 16, wherein forming the first probe member and the second probe member comprises
depositing the metal on the first and second sections of the photoresist material to respectively form the first probe member and the second probe member.

18. The method of claim 17, wherein:
the first probe member comprises the first section of the photoresist material and the metal deposited thereon; and
the second probe member comprises the second section of the photoresist material and the metal deposited thereon.

19. The method of claim 16, wherein forming the first probe member and the second probe member comprises:
selectively removing the first and second sections of the photoresist material to respectively form a first opening and a second opening in the photoresist material;
depositing the metal in the first and second openings to respectively form the first member and the second member; and
removing remaining photoresist material.

20. The method of claim 16, wherein the plurality of electrical test probes are to accommodate interconnect structures of a device under test that have no more than a 40 micron pitch.

* * * * *